US012529161B2

(12) United States Patent
Wang et al.

(10) Patent No.: US 12,529,161 B2
(45) Date of Patent: Jan. 20, 2026

(54) SYSTEMS FOR PREPARING CRYSTALS

(71) Applicant: MEISHAN BOYA ADVANCED MATERIALS CO., LTD., Sichuan (CN)

(72) Inventors: Yu Wang, Meishan (CN); Weiming Guan, Meishan (CN); Zhenxing Liang, Meishan (CN); Min Li, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 801 days.

(21) Appl. No.: 17/338,766

(22) Filed: Jun. 4, 2021

(65) Prior Publication Data

US 2021/0381123 A1 Dec. 9, 2021

(30) Foreign Application Priority Data

Jun. 5, 2020 (WO) ................ PCT/CN2020/094684
Apr. 9, 2021 (CN) ........................ 202110381291.3

(51) Int. Cl.
*C30B 15/02* (2006.01)
*C30B 15/10* (2006.01)
(Continued)

(52) U.S. Cl.
CPC .............. *C30B 15/02* (2013.01); *C30B 15/10* (2013.01); *C30B 15/14* (2013.01); *C30B 15/22* (2013.01);
(Continued)

(58) Field of Classification Search
CPC ....... C30B 15/002; C30B 15/02; C30B 15/10; C30B 15/14; C30B 15/22; C30B 29/20;
(Continued)

(56) References Cited

U.S. PATENT DOCUMENTS 4,197,136 A 4/1980 Inque et al.
4,897,100 A 1/1990 Nice
(Continued)

FOREIGN PATENT DOCUMENTS

CN 1542170 A * 11/2004 ............. C30B 11/00
CN 101086085 A 12/2007
(Continued)

OTHER PUBLICATIONS

European Patent Office, English computer translation of JP-2002303012 (Year: 2024).*
(Continued)

*Primary Examiner* — Matthew J Song
(74) *Attorney, Agent, or Firm* — METIS IP LLC

(57) ABSTRACT

Embodiments of the present disclosure may provide a system for preparing a crystal. The system may include a furnace, a heat insulation drum, a crucible component, a resistance heating component, and a heat insulation layer. The heat insulation drum may be located inside the furnace. The crucible component may be located inside the heat insulation drum. The resistance heating component may include a heating body. The heating body may include a plurality of heating units. The plurality of heating units may form a uniform temperature field. The heat insulation layer may be located around an outer side of the plurality of heating units, a top portion of the heat insulation drum, and/or a bottom portion of the crucible component.

19 Claims, 9 Drawing Sheets

(51) Int. Cl.

| | |
|---|---|
| ***C30B 15/14*** | (2006.01) |
| ***C30B 15/22*** | (2006.01) |
| ***C30B 29/22*** | (2006.01) |
| *C30B 29/28* | (2006.01) |
| *C30B 29/34* | (2006.01) |

(52) U.S. Cl.
CPC .............. *C30B 29/22* (2013.01); *C30B 29/28* (2013.01); *C30B 29/34* (2013.01)

(58) Field of Classification Search
CPC ......... C30B 29/22; C30B 29/28; C30B 29/34; C30B 35/007
See application file for complete search history.

(56) References Cited

U.S. PATENT DOCUMENTS

| | | | | | |
|---|---|---|---|---|---|
| 5,064,497 | A | * | 11/1991 | Clemans | C30B 35/002 117/81 |
| 5,116,456 | A | | 5/1992 | Nestor | |
| 5,167,759 | A | * | 12/1992 | Omino | C30B 11/002 117/223 |
| 5,698,029 | A | * | 12/1997 | Fujikawa | C30B 29/40 117/200 |
| 5,756,225 | A | * | 5/1998 | Morris | C30B 29/28 427/427 |
| 2001/0001944 | A1 | | 5/2001 | Kitamura et al. | |
| 2008/0254206 | A1 | | 10/2008 | Perera et al. | |
| 2009/0205783 | A1 | * | 8/2009 | Tanabe | C30B 29/08 118/724 |
| 2011/0146566 | A1 | * | 6/2011 | Schmid | C30B 29/42 117/81 |
| 2012/0126171 | A1 | | 5/2012 | Andreaco et al. | |
| 2013/0306874 | A1 | | 11/2013 | Yoshikawa et al. | |
| 2014/0061537 | A1 | | 3/2014 | Zagumennyi et al. | |
| 2015/0090179 | A1 | * | 4/2015 | Schmid | C30B 29/06 117/223 |
| 2018/0251908 | A1 | | 9/2018 | Hoshikawa et al. | |
| 2021/0180210 | A1 | | 6/2021 | Wang et al. | |

FOREIGN PATENT DOCUMENTS

| | | | | | |
|---|---|---|---|---|---|
| CN | 101267692 | A | | 9/2008 | |
| CN | 101333687 | A | | 12/2008 | |
| CN | 101481821 | A | | 7/2009 | |
| CN | 102268731 | A | | 12/2011 | |
| CN | 202380124 | U | | 8/2012 | |
| CN | 102877116 | A | | 1/2013 | |
| CN | 102995108 | A | | 3/2013 | |
| CN | 202945378 | U | | 5/2013 | |
| CN | 103147119 | A | | 6/2013 | |
| CN | 203049094 | U | | 7/2013 | |
| CN | 203393268 | U | | 1/2014 | |
| CN | 104294353 | A | | 1/2015 | |
| CN | 104451882 | A | | 3/2015 | |
| CN | 204724856 | U | * | 10/2015 | |
| CN | 105543963 | A | | 5/2016 | |
| CN | 106435712 | A | | 2/2017 | |
| CN | 106757318 | A | | 5/2017 | |
| CN | 105112993 | B | | 10/2017 | |
| CN | 107388823 | A | | 11/2017 | |
| CN | 104674344 | B | | 12/2017 | |
| CN | 108103568 | A | | 6/2018 | |
| CN | 108330533 | A | | 7/2018 | |
| CN | 208949444 | U | | 6/2019 | |
| JP | 10338594 | A | * | 12/1998 | C30B 15/10 |
| JP | 2002303012 | A | * | 10/2002 | E04B 2/56 |
| JP | 5601273 | B2 | | 10/2014 | |
| KR | 101333790 | B1 | * | 11/2013 | C30B 15/00 |
| KR | 101768205 | B1 | * | 8/2017 | C30B 29/20 |
| WO | WO-2010047429 | A1 | * | 4/2010 | C30B 11/002 |

OTHER PUBLICATIONS

European Patent Office, English computer translation of KR-101333790 (Year: 2024).*
English computer translation of JP-10338594-A (Year: 2024).*
English computer translation of CN-204724856-U (Year: 2024).*
English computer translation of CN-1542170-A (Year: 2025).*
English computer translation of KR-101768205-B1 (Year: 2025).*
First Office Action in Chinese Application No. 202110381291.3 mailed on Aug. 20, 2021, 14 pages.
First Office Action in Chinese Application No. 202080004460.5 mailed on Sep. 1, 2021, 27 pages.
First Office Action in Chinese Application No. 202110309970.X mailed on Sep. 10, 2021, 17 pages.
Hua, Shuman, Study on Crystal Growth, Defects, Spectrum and Laser Properties of $Yb^3$+-Doped in Yag Crystal, Chinese Doctoral Dissertations & Master's Theses Full-text Database(Master) Information Science and Technology, 2005, 76 pages.
Nie, Ying, Research on Growth and Annealing Discoloration Mechanism of Yb: YAG Crystal by HDS Method, Chinese Doctoral Dissertations & Master's Theses Full-text Database(Master) Engineering Science and Technology I , 2014, 74 pages.
The Extended European Search Report in European Application No. 20864333.8 mailed on Apr. 5, 2022, 9 pages.
Ren, Guohao et al., Investigation on Defects in Lu2SiO5:Ce Crystals Grown by Czochralski Method, Crystal Research and Technology, 41(2): 163-167, 2006.
Pan, Yuxin et al., Growth and Optical Properties of Dy:Y3AI5012 Crystal, Physica B: Condensed Matter, 530: 317-321, 2018.
Pier Carlo Ricci et al., Ce(3+)-doped Lutetium Yttrium Orthosilicate Crystals: Structural Characterization, Materials Science and Engineering B, 146: 2-6, 2008.
Hisashi Matsumura et al., Crystal Growth of Lutetium Oxyorthosilicate (LSO) by Melt-supply Double Crucible Czochralski (DC-CZ) Method, Journal of Crystal Growth, 308: 348-351, 2007.
International Search Report in PCT/CN2020/094684 mailed on Mar. 3, 2021, 10 pages.
Written Opinion in PCT/CN2020/094684 mailed on Mar. 3, 2021, 12 pages.

* cited by examiner

SYSTEMS FOR PREPARING CRYSTALS

CROSS-REFERENCE TO RELATED APPLICATIONS

This application claims priority to Chinese Patent Application No. 202110381291.3 filed on Apr. 9, 2021 and International Patent Application No. PCT/CN2020/094684 filed on Jun. 5, 2020, the entire contents of each of which are hereby incorporated by reference.

TECHNICAL FIELD

The present disclosure generally relates to a technical field of stimulated emission devices, and in particular, to devices for preparing crystals of the stimulated emission devices.

BACKGROUND

A stimulated emission device is a device that is excited by an external condition (e.g., gamma rays, X-rays) to cause electrons to perform an energy state transition, thereby emitting light. The stimulated emission device is widely used in fields such as industrial fields, medical fields, scientific research, communications, military fields, etc. Various crystalline materials (e.g., a scintillation crystal, a laser crystal) are often used in the stimulated emission device. In order to ensure a quality of a prepared crystal to improve a performance of the stimulated emission device, a system for preparing the crystal needs to satisfy a strict requirement (e.g., providing a stable temperature field). Therefore, it is desirable to provide an improved crystal preparation system for preparing a crystal with high quality.

SUMMARY

One embodiment of the present disclosure may provide a crystal preparation system. The crystal preparation system may include a furnace; a heat insulation drum, the heat insulation drum being located inside the furnace; a crucible component, the crucible component being located inside the heat insulation drum; a resistance heating component, the resistance heating component including a heating body, the heating body including a plurality of heating units, the plurality of heating units forming a uniform temperature field; a heat insulation layer, the heat insulation layer being located around an outer side of the plurality of heating units, a top portion of the heat insulation drum, and/or a bottom portion of the crucible component.

In some embodiments, the crucible component may at least include an inner crucible and an outer crucible.

In some embodiments, a material of the inner crucible may include at least one of iridium, platinum, tungsten, tantalum, molybdenum, or quartz. A material of the outer crucible may include at least one of graphite, aluminum oxide, zirconium oxide, tungsten, molybdenum, or tantalum.

In some embodiments, a thickness of the inner crucible may be smaller than a thickness of the outer crucible.

In some embodiments, a gap between the inner crucible and the outer crucible may be smaller than a predetermined gap value.

In some embodiments, the predetermined gap value may be within a range from 0.1 millimeters to 10 millimeters.

In some embodiments, the gap between the inner crucible and the outer crucible may be filled with a filler.

In some embodiments, a ratio between a volume of the filler and a volume of the gap may be within a range from 0.1:1 to 1:1.

In some embodiments, the plurality of heating units may be located around an outer circumference of the crucible component.

In some embodiments, a distance between the plurality of heating units and the crucible component may satisfy a predetermined condition.

In some embodiments, the predetermined condition may include that the distance between the plurality of heating units and the crucible component is within a range from 2 millimeters to 15 millimeters.

In some embodiments, resistance values of the plurality of heating units may be equal.

In some embodiments, the plurality of heating units may be obtained by grooving the heating body. Sizes of a plurality of grooves obtained by grooving the heating body may be equal.

In some embodiments, a ratio between an inner diameter of the heating body and a height of the heating body may be within a range from 1:1 to 1:20.

In some embodiments, a ratio between a height of the heating body and a height of the heat insulation drum may be within a range from 1:1 to 1:5.

In some embodiments, the resistance heating component may also include a connection component. The connection component may be configured to connect the heating body and a power source. The connection component may include an electrode rod. At least a portion of the electrode rod may pass through a through hole of a bottom plate of the furnace and connect to the power source. An end surface of the through hole may be equipped with a chamfer. The electrode rod and the bottom plate may be sealed via the chamfer, a sealing ring, and a sealing cushion.

In some embodiments, the connection component may also include an electrode plate. The electrode plate may be equipped with an electrode rod mounting hole and a heating body mounting hole. The electrode rod may be connected to the electrode plate via the electrode rod mounting hole. The heating body may be connected to the electrode plate via the heating body mounting hole.

In some embodiments, the heating body may be tightly connected to the electrode plate via at least one fastening ring. At least a portion of the at least one fastening ring may be located inside the heating body mounting hole. At least a portion of the at least one fastening ring may be located around an outer circumference of the heating body.

In some embodiments, at least one external diameter of the at least one fastening ring may gradually increase along a direction from a bottom portion of the heating body mounting hole to an upper end surface of the electrode plate.

In some embodiments, the crystal preparation system may also include a temperature control device. The temperature control device may be configured to adjust a height or a thickness of the heat insulation layer based on a temperature distribution in the heat insulation drum.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

Figure 1:
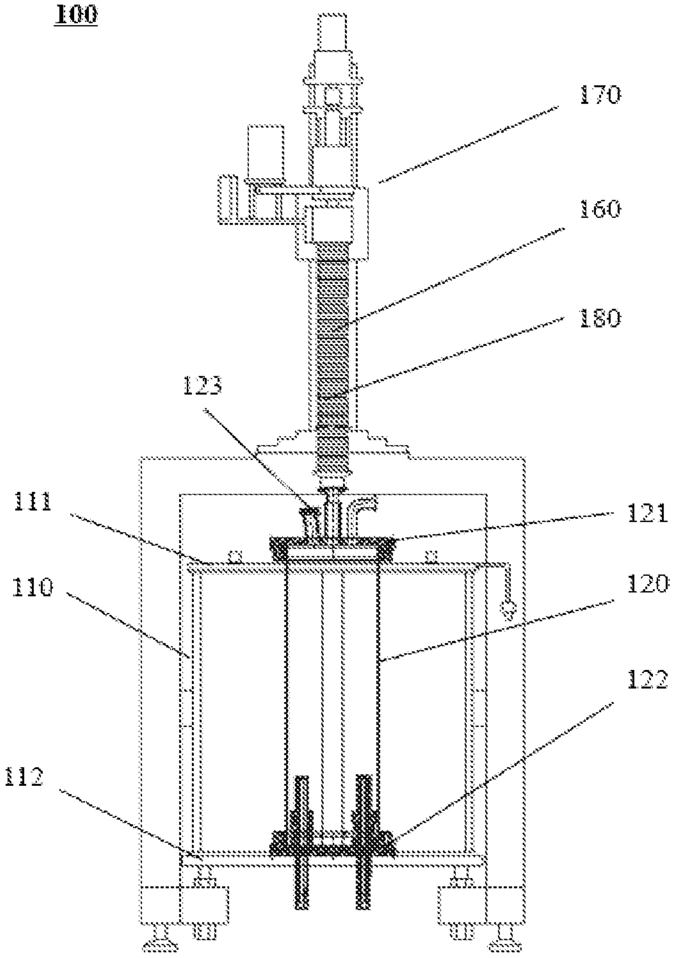
FIG. 1 is a schematic diagram illustrating an exemplary structure of a crystal preparation system according to some embodiments of the present disclosure.

In the drawings, 100 represents a crystal preparation system, 110 represents a furnace, 111 represents a furnace cover, 112 represents a bottom plate, 120 represents a heat insulation drum, 121 represents an upper sealing cover, 1211 represents a first through hole, 1212 represents a second through hole, 1213 represents a third through hole, 1214 represents an upper cooling channel, 122 represents a lower sealing cover, 1221 represents a fourth through hole, 1222 represents a supporting hole, 1223 represents a lower cooling channel, 1224 represents a chamfer, 123 represents an observation piece, 124 represents a main drum, 125 represents a supporting drum, 130 represents a crucible component, 131 represents a tray, 132 represents a crucible tray, 133 represents a cushion block, 1331 represents an upper cushion block, 1332 represents a lower cushion block, 134 represents a bottom tray, 135 represents an inner crucible, 136 represents an outer crucible, 137 represents a crucible cover, 1371 represents a through hole, 1372 represents an annular groove, 140 represents a resistance heating component, 141 represents a heating body, 1411 represents a heat generation portion, 1412 represents an electrode portion, 1413 represents a groove, 142 represents an electrode rod, 1421 represents a hollow pipe, 1422 represents a cooling annular gap, 1423 represents a water inlet, 1424 represents a water outlet, 143 represents an electrode plate, 1431 represents an electrode rod mounting hole, 1432 represents a heating body mounting hole, 1433 represents a cushion block through hole, 144 represents a fastening ring, 1441 represents a clamping plate, 150 represents a heat insulation layer, 151 represents a top heat insulation layer, 152 represents a side heat insulation layer, 153 represents a bottom heat insulation layer, 155 represents a crucible cover plate, 156 represents a positioning ring, 160 represents a pulling device, 170 represents a moving device, 180 represents a sealing sleeve, 190 represents a heat insulation drum, 191 represents an upper heat insulation drum, 1911 represents an upper-inner heat insulation drum, 1912 represents an upper-outer heat insulation drum, 192 represents a middle heat insulation drum, 193 represents a lower heat insulation drum, and 194 represents an upper cover plate.

DETAILED DESCRIPTION

In order to illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless apparent from the locale or otherwise stated, like reference numerals represent similar structures or operations in the drawings.

It will be understood that the terms "system," "device," "unit," and/or "module" used herein are one method to distinguish different components, elements, parts, sections, or assemblies of different levels. However, if other words may achieve the same purpose, the words may be replaced by other expressions.

As used in the disclosure and the appended claims, the singular forms "a," "an," and "the" include plural referents unless the content clearly dictates otherwise. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

FIG. 1 is a schematic diagram illustrating an exemplary structure of a crystal preparation system according to some embodiments of the present disclosure.

In some embodiments, the crystal preparation system 100 may be used to prepare various crystals used in a stimulated emission device. In some embodiments, the crystals used in the stimulated emission device may include a scintillation crystal (e.g., a lutetium yttrium silicate scintillation crystal), a laser crystal (e.g., an yttrium aluminum garnet crystal), etc. The crystal preparation system 100 in the embodiments of the present disclosure may be described in detail in connection with the drawings. It should be noted that the following embodiments are merely intended to illustrate the present disclosure and do not limit the scope of the present disclosure.

As shown in FIG. 1, the crystal preparation system 100 may include a furnace 110, a heat insulation drum 120, a crucible component (e.g., a crucible component 130 shown in FIG. 2 or FIG. 3, not shown in FIG. 1), a heating component (e.g., a resistance heating component 140 shown in FIG. 2 or FIG. 3, not shown in FIG. 1), a heat insulation layer (e.g., a heat insulation layer 150 shown in FIG. 2 or FIG. 3, not shown in FIG. 1), a vacuum device (not shown), a pulling device 160, and a moving device 170. In some embodiments, the heat insulation drum 120, the crucible component, the heating component, and/or the heat insulation layer may also be collectively referred to as a "temperature field device."

A shape of the furnace 110 may include a cylinder, a cube, a polygon prism (e.g., a triangular prism, a pentagonal prism, a hexagonal prism), etc. In some embodiments, the furnace 110 may include a furnace body, a furnace cover 111, and a bottom plate 112. The furnace cover 111 may be located at a top portion of the furnace body. The bottom plate 112 may be located at a bottom portion of the furnace body. In some embodiments, the furnace cover 111 may be equipped with a through hole configured to place the heat insulation drum 120. In some embodiments, the furnace cover 111 may be sealed or unsealed with an outer wall of the heat insulation drum 120. In some embodiments, the furnace 110 may be in a sealed structure or a non-sealed structure. In some embodiments, a material of the furnace 110 may include stainless steel or quartz.

At least a portion of the heat insulation drum 120 may be located within the furnace 110. In some embodiments, an upper end of the heat insulation drum 120 may be horizontal with an upper surface of the furnace cover 111. In some embodiments, the upper end of the heat insulation drum 120 may be higher than the upper surface of the furnace cover 111. In some embodiments, a shape of the heat insulation drum 120 may include a cylinder, a cube, a polygon prism (e.g., a triangular prism, a pentagonal prism, a hexagonal prism), etc. In some embodiments, a material of the heat insulation drum 120 may include quartz (silicon oxide), corundum (aluminum oxide), zirconium oxide, graphite, carbon fiber, ceramic, or any other high-temperature resistant materials (e.g., boride, carbide, nitride, silicide, phosphide, sulfide, etc. of a rare earth metal). For example, the heat insulation drum 120 may be a quartz pipe. More descriptions regarding the heat insulation drum 120 may be found elsewhere in the present disclosure (e.g., FIG. 2, FIG. 3, and the descriptions thereof), which are not repeated.

In some embodiments, the upper end of the heat insulation drum 120 may be equipped with an upper sealing cover 121. The upper sealing cover 121 may be sealedly connected (e.g., connected via a gluing connection or a clamping connection through a sealing ring) to the heat insulation drum 120. The upper sealing cover 121 may be equipped with a through hole. The heat insulation drum 120 may be connected to the vacuum device and the pulling device 160 via the through hole. More descriptions regarding the upper sealing cover 121 may be found elsewhere in the present disclosure (e.g., FIG. 10A, FIG. 10B, and the descriptions thereof), which are not repeated.

In some embodiments, a bottom end of the heat insulation drum 120 may be equipped with a lower sealing cover 122. The lower sealing cover 122 may be sealedly connected (e.g., connected via a gluing connection or a clamping connection through a sealing ring) to the heat insulation drum 120. In some embodiments, the bottom end of the heat insulation drum 120 may be not equipped with the lower sealing cover 122. The bottom end of the heat insulation drum 120 may be sealedly connected to the bottom plate 112. More descriptions regarding the lower sealing cover 122 may be found elsewhere in the present disclosure (e.g., FIG. 11A, FIG. 11B, and the descriptions thereof), which are not repeated.

In some embodiments, the crystal preparation system 100 may also include an observation piece 123. The observation piece 123 may be located at the upper sealing cover 121. An internal condition of the heat insulation drum 120 may be observed via the observation piece 123.

The crucible component may be configured to accommodate one or more raw materials required for a crystal growth. In some embodiments, the crucible component may include a single-layer crucible, a double-layer crucible, or a multi-layer crucible. In some embodiments, the crucible component may be movable, for example, upwards or downwards. In some embodiments, the crystal preparation system 100 may include an automatic device (e.g., an automatic arm) configured to move the crucible component. In some embodiments, the crystal preparation system 100 may include at least one supporting component (e.g., a tray 131, a cushion block 133, a crucible tray 132, a bottom tray 134 in FIG. 2) configured to support the crucible component. At least one of the at least one supporting component may be movable to move the crucible component. More descriptions regarding the crucible component may be found elsewhere in the present disclosure (e.g., FIG. 4, FIG. 5, and the descriptions thereof), which are not repeated.

The heating component may be configured to heat the crucible component. In some embodiments, the heating component may include an induction heating component, a resistance heating component, etc. In some embodiments, the heating component may be located around an outer circumference of the crucible component. In some embodiments, the heating component may be located around an outer circumference of the heat insulation drum 120. More descriptions regarding the heating component may be found elsewhere in the present disclosure (e.g., FIGS. 6-9 and the descriptions thereof), which are not repeated.

The heat insulation layer may be located around an outer side of the heating component, a top portion of the crucible component, and/or a bottom portion of the crucible component for heat preservation. In some embodiments, the heat insulation layer may include a heat insulation material of a block shape, a heat insulation material of a particulate shape, a heat insulation material of a flocculating shape, a heat insulation material of a sheet-like shape, etc. In some embodiments, a material of the heat insulation layer may include a high temperature resistant material, such as metal, aluminum oxide, zirconium oxide, silicon oxide, tempered aluminum, carbide, nitride, silicide, etc. More descriptions regarding the heat insulation layer may be found elsewhere in the present disclosure (e.g., FIG. 2, FIG. 3, and the descriptions thereof), which are not repeated.

The vacuum device may be configured to keep an interior of the heat insulation drum 120 at a vacuum environment or a pressure environment lower than a standard atmospheric pressure. In some embodiments, the vacuum device may be connected to the heat insulation drum 120 via a through hole of the upper sealing cover 121 and a pipe. In some embodiments, the vacuum device may include a vacuum component (e.g., a vacuum pump) and a gas storage component (e.g., a gas storage bottle), which may be configured to vacuumize and inlet a gas (e.g., an inert gas), respectively.

The pulling device 160 may be configured to move up and down and/or rotate to perform a crystal growth. In some embodiments, one end of the pulling device 160 may pass through the through hole of the upper sealing cover 121 and move within the heat insulation drum 120. In some embodiments, another end of the pulling device 160 may be connected to the moving device 170 in a transmission manner. The moving device 170 may drive the pulling device 160 to move up and down and/or rotate.

In some embodiments, an outside of the pulling device 160 may be sleeved with a sealing sleeve 180. One end of the sealing sleeve 180 may be connected to the heat insulation drum 120 via the through hole of the upper sealing cover 121. Another end of the sealing sleeve 180 may be sealedly connected (e.g., connected via a welding connection, a gluing connection, or a bolting connection) to the moving device 170. In some embodiments, the sealing sleeve 180 may keep the pulling device 160 in a sealed environment. In some embodiments, an air pressure environment inside the sealing sleeve 180 may be the same as or different from an air pressure environment inside the heat insulation drum 120.

In some embodiments, the crystal preparation system 100 may also include a temperature control device (not shown). The temperature control device may be configured to control a temperature field required for the crystal growth. The temperature field may reflect a distribution of internal temperatures of a temperature field device in time and space. In some embodiments, the temperature field may at least be formed by the heat insulation drum 120. For example, the temperature field may be formed by the heat insulation drum 120, the heating component, the heat insulation layer, and the lower sealing cover 122. In embodiments of the present disclosure, "temperature field," "thermal field," and "temperature distribution" may be used interchangeably unless otherwise stated.

In some embodiments, the temperature control device may include a temperature sensing component and a control component.

In some embodiments, the temperature sensing component may include at least one temperature sensing unit. The at least one temperature sensing unit may be configured to measure temperature information of an interior (e.g., the heat insulation drum 120) of the temperature field device, and transmit the measured temperature information to the control component. In some embodiments, the at least one temperature sensing unit may include, but not be limited to, an infrared temperature sensor, a microwave sensor, a thermocouple sensor, etc.

In some embodiments, the control component may determine a temperature distribution inside the temperature field device based on the temperature information. The temperature distribution may reflect a temperature condition inside the temperature field device, for example, a temperature value of a specific position (e.g., an interior of the crucible component, a side wall of the crucible component), an average temperature of a plurality of positions, a temperature variance of a plurality of positions, an overall global temperature distribution (e.g., a curve of the temperature distribution, a graph of the temperature distribution), etc.

In some embodiments, the control component may also adjust a height and/or a thickness of the heat insulation layer based on the temperature distribution and/or crystal growth information (e.g., a size, a weight, etc., of a crystal at a current time point) to maintain the temperature field uniform and stable. In some embodiments, the control component may also adjust the height and/or the thickness of the heat insulation layer, by considering parameters related to a specific crystal to be grown or being grown (e.g., a crystal type, a crystal size, a crystal performance), to adapt to growth requirements of different crystals. In some embodiments, the parameters related to the crystal to be grown or being grown may be obtained by one or more sensors (e.g., a radar sensor, a camera) of the crystal preparation system 100 or input by a user of the crystal preparation system 100. For example, a camera may capture an image of a crystal being grown at an arbitrary time point, and a crystal size of the crystal at the arbitrary time point may be obtained by analyzing the image. As another example, a user may input a crystal type of a crystal to be grown via an input device (e.g., a display, a keyboard) of the crystal preparation system 100. In some embodiments, the control component may adjust the height and/or the thickness of the heat insulation layer in real time during a crystal growth process to achieve a real-time control of the temperature field during the crystal growth process. In some embodiments, the control component may adjust the height and/or the thickness of the heat insulation layer at predetermined intervals. In some embodiments, the control component may adjust the height and/or the thickness of the heat insulation layer based on a trigger condition (e.g., a condition that a temperature is below a temperature threshold, a uniformity of the temperature distribution is below a uniformity threshold, a temperature gradient is out of a predetermined range of the temperature gradient).

In some embodiments, the control component and/or other processing devices may train a machine learning model based on historical crystal growth information. An input of the machine learning model may include crystal related parameters (e.g., a crystal type, a crystal size, a crystal performance, a crystal growth stage). An output may include temperature field information (e.g., a specific temperature value, a temperature gradient, a temperature distribution, a temperature variation curve with time) required for the crystal growth. In some embodiments, the control component may monitor crystal related parameters in real time, and determine the temperature field information based on the trained machine learning model. In some embodiments, the crystal related parameters may be monitored by one or more sensors (e.g., a radar sensor, a camera) of the crystal preparation system 100. Further, the control component may automatically adjust the height and/or the thickness of the heat insulation layer based on the temperature field information, thereby achieving real time adjustment of the temperature field during the crystal growth process.

In some embodiments, the temperature control device may also include a moving component. The moving component may be configured to adjust the height and/or the thickness of the heat insulation layer. In some embodiments, the moving component may include an electrically driven moving device, a magnetically driven moving device, a thermally driven moving device, a robot arm, a robot hand, etc.

In some embodiments, the temperature control device may also include a display component. The display component may be configured to display a temperature distribution inside the temperature field device at any time point. In some embodiments, the display component may also be configured to display a temperature distribution required for crystal growth at any time point. In some embodiments, the display component may also be configured to display comparison information between the temperature distribution inside the temperature field device at any time point and the temperature distribution required for the crystal growth at any time point (e.g., a difference between a temperature at a specific position of the temperature field device and a predetermined temperature at the specific position).

For example, when the temperature distribution of the temperature field is lower than a predetermined temperature range (e.g., a temperature range required for a specific crystal growth), the control component may control the moving component to move to increase the thickness of the heat insulation layer and/or improve the height of the heat insulation layer. As another example, when the temperature distribution of the temperature field is higher than the predetermined temperature range, the control component may control the moving component to move to decrease the thickness of the heat insulation layer and/or the height of the heat insulation layer. As a further example, when a temperature of an upper portion of the temperature field is lower than the predetermined temperature range, the control component may control the moving component to move to increase the height of the heat insulation layer. As still a further example, when the temperature of the upper portion of the temperature field is higher than the predetermined temperature range, the control component may control the moving component to move to decrease the height of the heat insulation layer. As still a further example, when a temperature distribution along a radial direction of the temperature field is non-uniform, the control component may control the moving component to move to adjust the thickness and/or height of the heat insulation layer to make temperatures at a plurality of positions of the heat insulation layer balanced, thereby making that the temperature field has a suitable temperature gradient along an axial direction for a specific crystal growth and a temperature distribution along the radial direction tends to be uniform.

It should be noted that the above descriptions of the crystal preparation system 100 are merely provided for the purposes of illustration, and not intended to limit the scope of the present disclosure. For persons having ordinary skills in the art, multiple variations and modifications of the crystal preparation system 100 may be made under the teachings of the present disclosure. However, those variations and modifications do not depart from the scope of the present disclosure. For example, the crystal preparation system 100 may also include a control system. The control system may control a moving parameter (e.g., a moving direction and/or a moving velocity) of the moving device 170 according to parameter requirements for the crystal growth process, thereby achieving an automatic control of the crystal growth and reducing a situation that a consistency of the crystal growth is unstable caused by an artificial participation. As another example, the heat insulation layer may be omitted. As a further example, the lower sealing cover 122 may be omitted, and the heat insulation drum 120 may be sealedly connected with the bottom plate 112.

Figure 2:
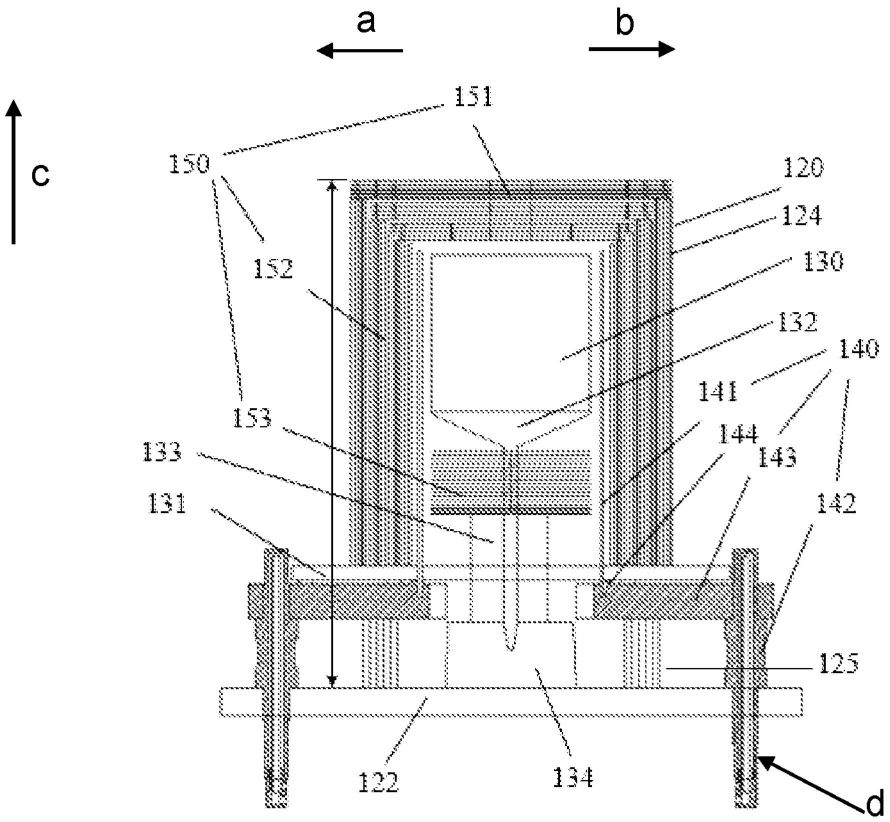
FIG. 2 is a schematic diagram illustrating an exemplary structure of a temperature field device according to some embodiments of the present disclosure.

FIG. 2 is a schematic diagram illustrating an exemplary structure of a temperature field device according to some embodiments of the present disclosure.

As shown in FIG. 2, the temperature field device may include a heat insulation drum 120, a crucible component 130, a resistance heating component 140, and a heat insulation layer 150. In some embodiments, the crucible component 130 may be an independent component from the temperature field device.

The heat insulation drum 120 may be configured to accommodate at least a portion of the crucible component 130, the resistance heating component 140, and the heat insulation layer 150. In some embodiments, the heat insulation drum 120 may include a main drum 124 and a supporting drum 125. The supporting drum 125 may be located below the main drum 124. In some embodiments, in order to make that an interior of the heat insulation drum 120 has a temperature field suitable for a crystal growth, a ratio between a height of the main drum 124 and a height of the supporting drum 125 may need to satisfy a predetermined condition. In some embodiments, the ratio between the height of the main drum 124 and the height of the supporting drum 125 may be within a range from 1:1 to 15:1. In some embodiments, the ratio between the height of the main drum 124 and the height of the supporting drum 125 may be within a range from 2:1 to 13:1. In some embodiments, the ratio between the height of the main drum 124 and the height of the supporting drum 125 may be within a range from 3:1 to 11:1. In some embodiments, the ratio between the height of the main drum 124 and the height of the supporting drum 125 may be within a range from 4:1 to 9:1. In some embodiments, the ratio between the height of the main drum 124 and the height of the supporting drum 125 may be within a range from 5:1 to 8:1. In some embodiments, the ratio between the height of the main drum 124 and the height of the supporting drum 125 may be within a range from 6:1 to 7:1. In some embodiments, the height of the main drum 124 and the height of the heat insulation layer 152 side from the main drum 124 may be the same or different.

More descriptions regarding the crucible component 130 may be found elsewhere in the present disclosure (e.g., FIG. 4, FIG. 5, and the descriptions thereof), which are not repeated.

The resistance heating component 140 may be configured to heat the crucible component 130. The resistance heating manner can effectively prevent the crucible component from being broken by fire due to an electric potential difference formed between inner and outer walls of the crucible and improve energy conversion efficiency. In some embodiments, the resistance heating component 140 may realize a heating operation through a direct current (DC) power source or an alternate current (AC) power source. For example, the resistance heating component 140 may realize the heating operation through the DC power source, making the temperature field control more stable.

In some embodiments, the resistance heating component 140 may include a heating body 141. In some embodiments, the heating body 141 may be located around an outer circumference of the crucible component 130. In some embodiments, a material of the heating body 141 may include graphite, tungsten, molybdenum, iridium, platinum, nickel chromium alloy, silicone rod, etc.

A ratio between a height of the heating body 141 and the height of the heat insulation drum 120 may affect the temperature gradient (and further affect the crystal growth). For example, if the ratio between the height of the heating body 141 and the height of the heat insulation drum 120 is relatively large, a temperature gradient between a liquid surface inside the crucible component 130 and an upper portion of a temperature field along an axial direction may be caused to be relatively small, which is harmful to the crystal growth. If the ratio between the height of the heating body 141 and the height of the heat insulation drum 120 is relatively small, the temperature gradient between the liquid surface inside the crucible component 130 and the upper portion of the temperature field along the axial direction may be caused to be relatively large, which may cause the crystal being grown to crack and affect a quality of the crystal. Therefore, in some embodiments, in order to maintain a suitable temperature distribution inside the crucible component 130 and/or the heat insulation drum 120, the ratio between the height of the heating body 141 and the height (which can be understood as a height of the heat insulation drum 120 shown by a two-way arrow in FIG. 2, that is, a sum of a height of the main drum 124 and a height of the supporting drum 125) of the temperature field may need to satisfy a predetermined requirement.

In some embodiments, the ratio between the height of the heating body 141 and the height of the heat insulation drum 120 may be within a range from 1:1 to 1:10. In some embodiments, the ratio between the height of the heating body 141 and the height of the heat insulation drum 120 may be within a range from 1:1 to 1:8. In some embodiments, the ratio between the height of the heating body 141 and the height of the heat insulation drum 120 may be within a range from 1:1 to 1:6. In some embodiments, the ratio between the height of the heating body 141 and the height of the heat insulation drum 120 may be within a range from 1:1 to 1:5. In some embodiments, the ratio between the height of the heating body 141 and the height of the heat insulation drum 120 may be within a range from 1:1 to 1:4. In some embodiments, the ratio between the height of the heating body 141 and the height of the heat insulation drum 120 may be within a range from 1:1 to 1:3. In some embodiments, the ratio between the height of the heating body 141 and the height of the heat insulation drum 120 may be within a range from 1:1 to 1:2. In some embodiments, the ratio between the height of the heating body 141 and the height of the heat insulation drum 120 may be within a range from 1:1 to 1:1.8. In some embodiments, the ratio between the height of the heating body 141 and the height of the heat insulation drum 120 may be within a range from 1:1 to 1:1.5.

In some embodiments, the heating body 141 may include a plurality of heating units. For example, the plurality of heating units may be obtained by grooving the heating body 141 (details can be found in FIG. 6 and the descriptions thereof). In some embodiments, the plurality of heating units may be located around the outer circumference of the crucible component 130. A distance between the plurality of heating units and the crucible component 130 may affect a heat transmission between the plurality of heating units and the crucible component 130. For example, if the distance is relatively large, a heat loss during a transmission from the plurality of heating units to the crucible component 130 may be relatively high. If the distance is relatively small, the crucible component 130 may be damaged. Therefore, the distance between the plurality of heating units and the crucible component 130 may need to satisfy a predetermined condition.

In some embodiments, the plurality of heating units may be uniformly or non-uniformly distributed. For example, the plurality of heating units may be distributed in parallel and equidistantly. As another example, the plurality of heating units may be distributed according to actual requirements. The distance between the plurality of heating units and the crucible component 130 may refer to an average distance of distances between the plurality of heating units and the crucible component 130. In some embodiments, the predetermined condition may include that the distance between the plurality of heating units and the crucible component 130 may be within a range from 2 millimeters to 50 millimeters. In some embodiments, the predetermined condition may include that the distance between the plurality of heating units and the crucible component 130 may be within a range from 3 millimeters to 20 millimeters. In some embodiments, the predetermined condition may include that the distance between the plurality of heating units and the crucible component 130 may be within a range from 4 millimeters to 18 millimeters. In some embodiments, the predetermined condition may include that the distance between the plurality of heating units and the crucible component 130 is within a range from 5 millimeters to 15 millimeters. In some embodiments, the predetermined condition may include that the distance between the plurality of heating units and the crucible component 130 may be within a range from 6 millimeters to 14 millimeters. In some embodiments, the predetermined condition may include that the distance between the plurality of heating units and the crucible component 130 may be within a range from 7 millimeters to 13 millimeters. In some embodiments, the predetermined condition may include that the distance between the plurality of heating units and the crucible component 130 may be within a range from 8 millimeters to 12 millimeters. In some embodiments, the predetermined condition may include that the distance between the plurality of heating units and the crucible component 130 may be within a range from 9 millimeters to 11 millimeters. In some embodiments, the predetermined condition may include that the distance between the plurality of heating units and the crucible component 130 may be 10 millimeters.

In some embodiments, the plurality of heating units may form a uniform temperature field to provide a uniform temperature field required for a crystal growth, ensuring the crystal quality. In some embodiments, the plurality of heating units may be formed by connecting a plurality of heating units with a same resistance value. In some embodiments, the plurality of heating units may be obtained by grooving the heating body 141. In some embodiments, sizes of a plurality of grooves obtained by grooving may be the same or different. More descriptions regarding the heating body 141 may be found elsewhere in the present disclosure (e.g., FIG. 6 and the descriptions thereof), which are not repeated.

In some embodiments, the resistance heating component 140 may also include a connection component. The connection component may be configured to connect the heating body 141 and a power source to form a current circuit. In some embodiments, the power source may be disposed in the crystal preparation system 100, for example, an outer wall of the resistance heating component 140, a bottom wall of the furnace, etc. In some embodiments, the power source may be external to the crystal preparation system 100. The power source may be connected to the crystal preparation system 100 through a power source cable. For example, the power source cable may be located at a position d of the crystal preparation system 100 shown in FIG. 2. In some embodiments, the power source may be a power source external to and connected to the crystal preparation system 100.

In some embodiments, the connection component may include an electrode rod 142. In some embodiments, at least a portion of the electrode rod 142 may pass through a through hole of the lower sealing cover 122 and a through hole of the bottom plate 112 and connect to the power source. More descriptions regarding the electrode rod 142 may be found elsewhere in the present disclosure (e.g., FIG. 7 and the descriptions thereof), which are not repeated.

In some embodiments, the connection component may also include an electrode plate 143. The electrode plate 143 may be equipped with one or more mounting holes to connect to the electrode rod 142 and the heating body 141. In some embodiments, the connection component may also include at least one fastening ring 144. The heating body 141 may be tightly connected (e.g., connected via a clamping connection) to the electrode plate 143 via the at least one fastening ring 144. More descriptions regarding the electrode plate 143 and the at least one fastening ring 144 may be found elsewhere in the present disclosure (e.g., FIG. 8, FIG. 9, and the descriptions thereof), which are not repeated.

The heat insulation layer 150 may be located around an outer side of the plurality of heating units, a top portion of the heat insulation drum 120 (or a top portion of the crucible component 130), and/or a bottom portion of the crucible component 130 for heat preservation, preventing a temperature field required for a crystal growth from being disturbed by outside influence, which may result in a decrease in the crystal quality. In some embodiments, a material of the heat insulation layer 150 may include a high-temperature resistant material, for example, metal, aluminum oxide, zirconium oxide, silicon oxide, tempered aluminum, carbide, nitride, silicide, etc.

In some embodiments, as shown in FIG. 2, the heat insulation layer 150 may include a top heat insulation layer 151, a side heat insulation layer 152, and a bottom heat insulation layer 153. In some embodiments, the top heat insulation layer 151 may be located at a top portion of the plurality of heating units and the crucible component 130 (e.g., a top portion of an inner side of the heat insulation drum 120). In some embodiments, the side heat insulation layer 152 may be located around an outside of the plurality of heating units. In some embodiments, the bottom heat insulation layer 153 may be located at the bottom portion of the crucible component 130.

In some embodiments, the side heat insulation layer 152 may include at least one heat insulation layer with a same height or different heights. In some embodiments, in a direction (e.g., a width direction indicated by arrow a or arrow b in FIG. 2) from near the heating body 141 to relatively away from the heating body 141, a height of the side heat insulation layer 152 may gradually increase to reduce a heat loss and further make a temperature field required for a crystal growth more stable and uniform. In some embodiments, the top heat insulation layer 151 may include at least one heat insulation layer with a same length or different lengths. In some embodiments, in a direction (e.g., a vertical direction indicated by arrow c in FIG. 2) from near the heating body 141 or the crucible component 130 to relatively away from the heating body 141 or the crucible component 130, the length of the top heat insulation layer 151 may gradually increase to reduce the heat loss and further make the temperature field required for the crystal growth more stable and uniform.

In some embodiments, the temperature field device may also include a tray 131. In some embodiments, the tray 131 may be configured to support the bottom heat insulation layer 153, the crucible component 130, and/or the side heat insulation layer 152. In some embodiments, the tray 131 may be equipped with an annular groove. The annular groove may be configured to mount and fix the side heat insulation layer 152 via, for example, a clamping connection, a gluing connection, a welding connection, a threading connection, etc. Accordingly, the side heat insulation layer 152 can be stabilized, ensuring stability and uniformity of a temperature field required for a crystal growth. In some embodiments, the supporting drum 125 or the tray 131 may be insulated from the resistance heating component 140. In some embodiments, there may be a gap between the supporting drum 125 and the resistance heating component 140. For example, the gap between the supporting drum 125 and the resistance heating component 140 may range from 1 millimeter to 30 millimeters. As another example, the gap between the supporting drum 125 and the resistance heating component 140 may range from 5 millimeters to 25 millimeters. As a further example, the gap between the supporting drum 125 and the resistance heating component 140 may range from 10 millimeters to 20 millimeters. In some embodiments, there may be a gap between the tray 131 and the resistance heating component 140. For example, the gap between the tray 131 and the resistance heating component 140 may range from 1 millimeter to 30 millimeters. As another example, the gap between the tray 131 and the resistance heating component 140 may range from 5 millimeters to 25 millimeters. As a further example, the gap between the tray 131 and the resistance heating component 140 may range from 10 millimeters to 20 millimeters.

In some embodiments, a size of the annular groove may match a size of the side heat insulation layer 152. In some embodiments, an inner diameter and an outer diameter of the annular groove may be equal to or different from an inner diameter and an outer diameter of the side heat insulation layer 152, respectively. In some embodiments, the inner diameter of the annular groove may be smaller than the inner diameter of the side heat insulation layer 152, the outer diameter of the annular groove may be larger than the outer diameter of the side heat insulation layer 152. In some embodiments, a difference between the inner diameter of the annular groove and the inner diameter of the side heat insulation layer 152 may be within a predetermined range, a difference between the outer diameter of the annular groove and the outer diameter of the side heat insulation layer 152 may be within the predetermined range. Accordingly, the side heat insulation layer 152 can be clamped with the annular groove. In some embodiments, the predetermined range may be from 1 millimeter to 10 millimeters. In some embodiments, the predetermined range may be from 2 millimeters to 9 millimeters. In some embodiments, the predetermined range may be from 3 millimeters to 8 millimeters. In some embodiments, the predetermined range may be from 4 millimeters to 7 millimeters. In some embodiments, the predetermined range may be from 5 millimeters to 6 millimeters.

In some embodiments, the temperature field device may also include a crucible tray 132, a cushion block 133, and a bottom tray 134 configured to support the crucible component 130. In some embodiments, the crucible component 130 may be placed above the crucible tray 132. In some embodiments, the crucible tray 132 may pass through the bottom heat insulation layer 153, penetrate the cushion block 133, and be fixedly connected to a supporting hole 1222 of the bottom tray 134. In some embodiments, the bottom tray 134 may be located on the lower sealing cover 122 or the bottom plate 112. In some embodiments, there may be a gap between the crucible tray 132 and the heating body 141.

In some embodiments, in order to ensure a temperature field required for a crystal growth to be stable and uniform, a concentricity and/or a perpendicularity of the temperature field device and the crucible component 130 may need to be controlled. In some embodiments, a concentricity and/or a perpendicularity of the pulling device 160 (e.g., a pulling rod) and the crucible component 130 may also need to be controlled. In some embodiments, a concentricity and/or a perpendicularity of the pulling device 160, a weighting sensor (which may be configured to weight raw materials for a crystal growth and/or a crystal being grown) connected to or mounted on the pulling device 160, and the crucible component 130 may also need to be controlled. As used herein, a concentricity of two or more components may refer to a maximum distance among centers of the components. A perpendicularity of two or more components may refer to a maximum included angle among the components along a vertical direction.

In some embodiments, the concentricity of the temperature field device and the crucible component 130 (or a concentricity of the pulling device 160 and the crucible component 130, or a concentricity of the pulling device 160, the weighting sensor, and the crucible component 130, which are not be repeated below for brevity) may be no larger than 50 millimeters. In some embodiments, the concentricity of the temperature field device and the crucible component 130 may be no larger than 30 millimeters. In some embodiments, the concentricity of the temperature field device and the crucible component 130 may be no larger than 20 millimeters. In some embodiments, the concentricity of the temperature field device and the crucible component 130 may be no larger than 18 millimeters. In some embodiments, the concentricity of the temperature field device and the crucible component 130 may be no larger than 15 millimeters. In some embodiments, the concentricity of the temperature field device and the crucible component 130 may be no larger than 12 millimeters. In some embodiments, the concentricity of the temperature field device and the crucible component 130 may be no larger than 10 millimeters. In some embodiments, the concentricity of the temperature field device and the crucible component 130 may be no larger than 8 millimeters. In some embodiments, the concentricity of the temperature field device and the crucible component 130 may be no larger than 5 millimeters. In some embodiments, the concentricity of the temperature field device and the crucible component 130 may be no larger than 4 millimeters. In some embodiments, the concentricity of the temperature field device and the crucible component 130 may be no larger than 3 millimeters. In some embodiments, the concentricity of the temperature field device and the crucible component 130 may be no larger than 2.5 millimeters. In some embodiments, the concentricity of the temperature field device and the crucible component 130 may be no larger than 2 millimeters. In some embodiments, the concentricity of the temperature field device and the crucible component 130 may be no larger than 1.5 millimeters. In some embodiments, the concentricity of the temperature field device and the crucible component 130 may be no larger than 1 millimeter. In some embodiments, the concentricity of the temperature field device and the crucible component 130 may be no larger than 0.5 millimeters. In some embodiments, the concentricity of the temperature field device and the crucible component 130 may be no larger than 0.2 millimeters. In some embodiments, the concentricity of the temperature field device and the crucible component 130 may be no larger than 0.1 millimeters.

In some embodiments, the perpendicularity of the temperature field device and the crucible component 130 (or a perpendicularity of the pulling device 160 and the crucible component 130, or a perpendicularity of the pulling device 160, the weighting sensor, and the crucible component 130, which are not be repeated below for brevity) may be no larger than 15 degrees. In some embodiments, the perpendicularity of the temperature field device and the crucible component 130 may be no larger than 10 degrees. In some embodiments, the perpendicularity of the temperature field device and the crucible component 130 may be no larger than 8 degrees. In some embodiments, the perpendicularity of the temperature field device and the crucible component 130 may be no larger than 6 degrees. In some embodiments, the perpendicularity of the temperature field device and the crucible component 130 may be no larger than 4 degrees. In some embodiments, the perpendicularity of the temperature field device and the crucible component 130 may be no larger than 3 degrees. In some embodiments, the perpendicularity of the temperature field device and the crucible component 130 may be no larger than 2 degrees. In some embodiments, the perpendicularity of the temperature field device and the crucible component 130 may be no larger than 1.5 degrees. In some embodiments, the perpendicularity of the temperature field device and the crucible component 130 may be no larger than 1 degree. In some embodiments, the perpendicularity of the temperature field device and the crucible component 130 may be no larger than 0.5 degrees. In some embodiments, the perpendicularity of the temperature field device and the crucible component 130 may be no larger than 0.3 degrees. In some embodiments, the perpendicularity of the temperature field device and the crucible component 130 may be no larger than 0.2 degrees. In some embodiments, the perpendicularity of the temperature field device and the crucible component 130 may be no larger than 0.1 degrees.

It should be noted that the above descriptions of the temperature field device are merely provided for the purposes of illustration, and not intended to limit the scope of the present disclosure. For persons having ordinary skills in the art, multiple variations and modifications of the temperature field device may be made under the teachings of the present disclosure. However, those variations and modifications do not depart from the scope of the present disclosure. For example, the control component may also adjust parameters (e.g., a resistance of a heating unit, a current of a heating unit, a heating power, a count of the grooves, a depth of a groove, a width of a groove) of the plurality of heating units based on the temperature distribution, maintaining the temperature field uniform and stable.

Figure 3:
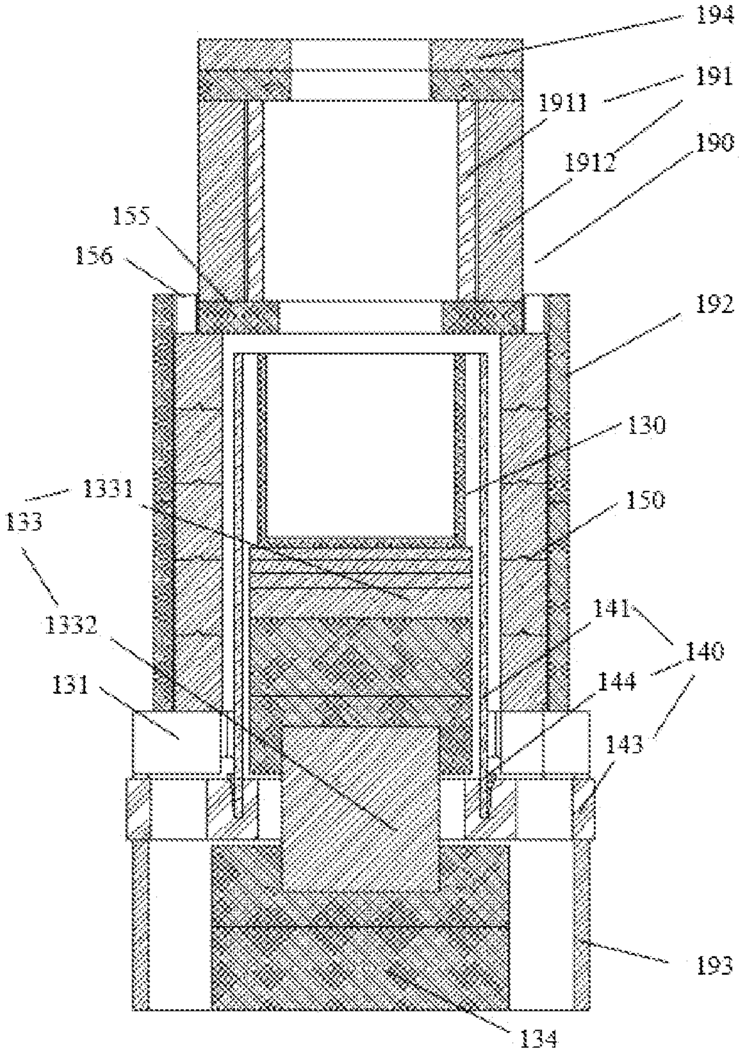
FIG. 3 is a schematic diagram illustrating an exemplary structure of a temperature field device according to some other embodiments of the present disclosure.

FIG. 3 is a schematic diagram illustrating an exemplary structure of a temperature field device according to some other embodiments of the present disclosure.

As shown in FIG. 3, the temperature field device may include a heat insulation drum 190 (for convenience of description, the heat insulation drum is separately numbered herein, and it can be understood that the heat insulation drum 190 is an example of the heat insulation drum 120), the crucible component 130, the resistance heating component 140, and the heat insulation layer 150. In some embodiments, the crucible component 130 may also be an independent component from the temperature field device.

More descriptions regarding the crucible component 130 may be found elsewhere in the present disclosure (e.g., FIG. 4, FIG. 5, and the descriptions thereof), which are not repeated. More descriptions regarding the resistance heating component 140 may be found elsewhere in the present disclosure (e.g., FIG. 2 and the descriptions thereof), which are not repeated.

The heat insulation drum 190 may include an upper heat insulation drum 191, a middle heat insulation drum 192, and a lower heat insulation drum 193. In combination with the related descriptions of the heat insulation drum 120 in FIG. 2, the lower heat insulation drum 193 can be understood as a “supporting drum”. Accordingly, in some embodiments, in order to make that the heat insulation drum 190 has a temperature field suitable for a crystal growth, a ratio of a sum of a height of the upper heat insulation drum 191 and a height of the middle heat insulation drum 192 to a height of the lower heat insulation drum 193 may need to satisfy a predetermined condition. More descriptions regarding the predetermined condition may be found elsewhere in the present disclosure (e.g., FIG. 2 and the descriptions thereof), which are not repeated.

In some embodiments, the upper heat insulation drum 191 may be located above the crucible component 130. In some embodiments, the upper heat insulation drum 191 may include an upper and inner heat insulation drum 1911 and an upper and outer heat insulation drum 1912. In some embodiments, a top portion of the upper heat insulation drum 191 may also be equipped with a top cover 194. The top cover 194 may be equipped with a through hole. The heat insulation drum 190 may be connected to a vacuum device and the pulling device 160 via the through hole.

In some embodiments, the middle heat insulation drum 192 may be configured to accommodate the crucible component 130, the resistance heating component 140, and the heat insulation layer 150.

In some embodiments, the lower heat insulation drum 193 may be sealedly connected (e.g., connected via a gluing connection or a clamping connection through a sealing ring) to the lower sealing cover 122 or the bottom plate 112.

In some embodiments, as described in connection with FIG. 2, the temperature field device may also include a tray 131. In some embodiments, the tray 131 may be configured to support the middle heat insulation drum 192, and the heat insulation layer 150. In some embodiments, the tray 131 may be equipped with an annular groove. The annular groove may be configured to mount and fix the heat insulation layer 150 and the middle heat insulation drum 192. Accordingly, the heat insulation layer 150 and the middle heat insulation drum 192 may be stabilized, ensuring stability and uniformity of a temperature field required for a crystal growth. More descriptions regarding the tray 131 may be found elsewhere in the present disclosure (e.g., FIG. 2 and the descriptions thereof), which are not repeated.

In some embodiments, the temperature field device may also include the cushion block 133 and the bottom tray 134 configured to support the crucible component 130. In some embodiments, the crucible component 130 may be located above the cushion block 133. In some embodiments, the bottom tray 134 may be located on the lower sealing cover 122 or the bottom plate 112. In some embodiments, a concentricity of the crucible component 130 and the temperature field device may also be adjusted by the cushion block 133 and the bottom tray 134.

In some embodiments, the cushion block 133 may include at least one upper cushion block 1331 and at least one lower cushion block 1332 stack in a vertical direction. In some embodiments, the crucible component 130 may be located on an upper end of the upper cushion block 1331. In some embodiments, a lower end of the upper cushion block 1331 may be equipped with a lower mounting hole. An upper end of the lower cushion block 1332 may be mounted inside the mounting hole. In some embodiments, an upper end of the bottom tray 134 may be equipped with a mounting hole. A lower end of the lower cushion block 1332 may be mounted inside the mounting hole.

In some embodiments, the temperature field device may also include a crucible cover plate 155 and a positioning ring 156. The crucible cover plate 155 may be equipped with a through hole through which the pulling device 160 may be pulled. In some embodiments, the crucible cover plate 155 may be located above the heat insulation layer 150. In some embodiments, the upper heat insulation drum 191 may be located above the middle heat insulation drum 192 via the crucible cover plate 155. In some embodiments, the positioning ring 156 may be located around an outer circumference of the crucible cover plate 155 and configured to stabilize the crucible cover plate 155 and further stabilize a temperature field required for a crystal growth.

In some embodiments, materials of the upper heat insulation drum 191, the middle heat insulation drum 192, the lower heat insulation drum 193, the upper cover 194, the crucible cover plate 155, the tray 131, the cushion block 133, or the bottom tray 134 may include quartz (silicon oxide), corundum (aluminum oxide), zirconium oxide, graphite, carbon fiber, ceramic, or the like, or any other high-temperature resistant materials, for example, boride, carbide, nitride, silicide, phosphide, sulfide, etc. of a rare earth metal.

It should be noted that the above descriptions of the temperature field device are merely provided for the purposes of illustration, and not intended to limit the scope of the present disclosure. For persons having ordinary skills in the art, multiple variations and modifications of the temperature field device may be made under the teachings of the present disclosure. However, those variations and modifications do not depart from the scope of the present disclosure.

Figure 4:
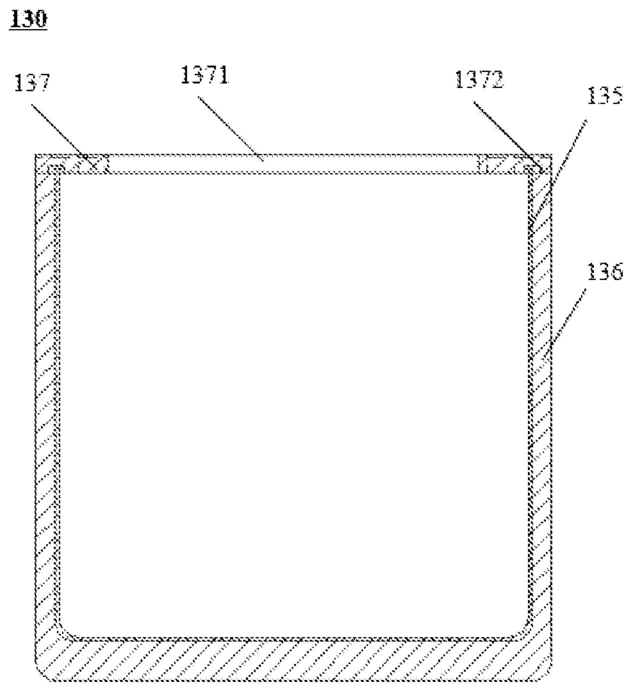
FIG. 4 is a schematic diagram illustrating an exemplary structure of a crucible component according to some embodiments of the present disclosure.
Figure 5:
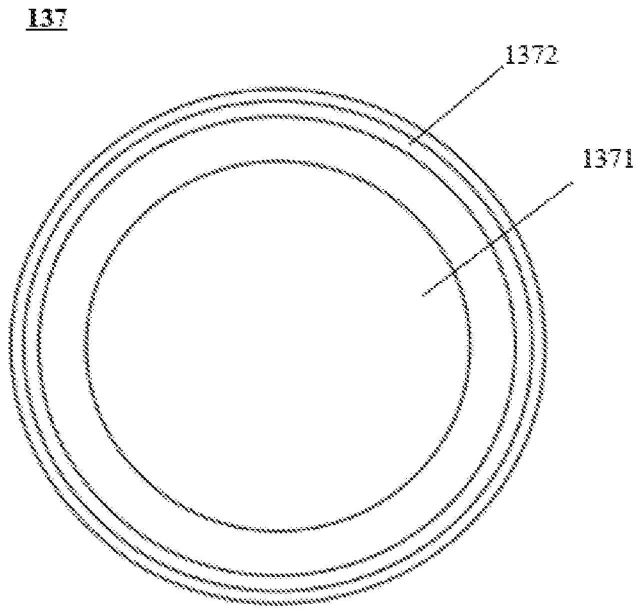
FIG. 5 is a top view illustrating an exemplary crucible cover according to some embodiments of the present disclosure.

FIG. 4 is a schematic diagram illustrating an exemplary structure of a crucible component according to some embodiments of the present disclosure. FIG. 5 is a top view illustrating an exemplary crucible cover according to some embodiments of the present disclosure.

As shown in FIG. 4, the crucible component 130 may at least include an inner crucible 135 and an outer crucible 136. The inner crucible 135 may be located inside the outer crucible 136. The inner crucible 135 and the outer crucible 136 may be tightly fitted. In some embodiments, the inner crucible 135 may be tightly fitted with the outer crucible 136 by heating the outer crucible 136 according to the principle of heat expansion and cold contraction.

In some embodiments, there may be a gap between the inner crucible 135 and the outer crucible 136. In order to ensure a heat conductivity between the inner crucible 135 and the outer crucible 136, and further ensure a stability of a temperature field required for a crystal growth, the gap may need to be controlled to be smaller than a predetermined gap value.

In some embodiments, the predetermined gap value may be within a range from 0 millimeters to 100 millimeters. In some embodiments, the predetermined gap value may be within a range from 0 millimeters to 80 millimeters. In some embodiments, the predetermined gap value may be within a range from 0 millimeters to 50 millimeters. In some embodiments, the predetermined gap value may be within a range from 0 millimeters to 20 millimeters. In some embodiments, the predetermined gap value may be within a range from 0.1 millimeters to 18 millimeters. In some embodiments, the predetermined gap value may be within a range from 0.1 millimeters to 16 millimeters. In some embodiments, the predetermined gap value may be within a range from 0.1 millimeters to 14 millimeters. In some embodiments, the predetermined gap value may be within a range from 0.1 millimeters to 12 millimeters. In some embodiments, the predetermined gap value may be within a range from 0.1 to 10 millimeters. In some embodiments, the predetermined gap value may be within a range from 0.2 millimeters to 9 millimeters. In some embodiments, the predetermined gap value may be within a range from 0.3 millimeters to 8 millimeters. In some embodiments, the predetermined gap value may be within a range from 0.4 millimeters to 7 millimeters. In some embodiments, the predetermined gap value may be within a range from 0.5 millimeters to 6 millimeters. In some embodiments, the predetermined gap value may be within a range from 0.6 millimeters to 5 millimeters. In some embodiments, the predetermined gap value may be within a range from 0.7 millimeters to 4 millimeters. In some embodiments, the predetermined gap value may be within a range from 0.8 millimeters to 3 millimeters. In some embodiments, the predetermined gap value may be within a range from 0.9 millimeters to 2 millimeters. In some embodiments, the predetermined gap value may be 1 millimeter.

In some embodiments, the gap may be filled with a filler to ensure the heat conductivity between the inner crucible 135 and the outer crucible 136 and stabilize the temperature field required for the crystal growth. In some embodiments, the filler may be made of a high-temperature resistant material. In some embodiments, a material of the filler may include, but not be limited to, silicon oxide, tempered aluminum, zirconium oxide, graphite, carbon fiber, ceramic, boride, carbide, nitride, silicide, phosphide, sulfide, etc. of a rare earth metal, etc. In some embodiments, the filler may include a block shaped filler, a particulate shaped filler, a flocculating shaped filler, a sheet-like shaped filler, etc. Merely by way example, the filler may include zircon sand (silicate compound of zirconium), zirconium oxide particle, aluminum oxide particle, zirconium oxide felt, zirconium oxide brick, aluminum oxide brick, or other high-temperature particulate materials.

In some embodiments, in order to ensure the thermal conductivity between the inner crucible 135 and the outer crucible 136 and further ensure the stability of the temperature field required for the crystal growth, a ratio between a volume of the filler and a volume of the gap may need to be controlled within a predetermined range. In the present disclosure, the volume of the filler may be represented as a packing volume of the filler, and the volume of the gap may be represented as an annular volume of a gap formed by an outer wall of the inner crucible 135 and an inner wall of the outer crucible 136.

In some embodiments, the ratio between the volume of the filler and the volume of the gap may be within a range from 0.1:1 to 1:1. In some embodiments, the ratio between the volume of the filler and the volume of the gap may be within a range from 0.2:1 to 0.9:1. In some embodiments, the ratio between the volume of the filler and the volume of the gap may be within a range from 0.3:1 to 0.8:1. In some embodiments, the ratio between the volume of the filler and the volume of the gap may be within a range from 0.4:1 to 0.7:1. In some embodiments, the ratio between the volume of the filler and the volume of the gap may be within a range from 0.5:1 to 0.6:1.

In some embodiments, a material of the inner crucible 135 may include, but not be limited to, iridium, platinum, tungsten, tantalum, molybdenum, graphite, quartz, or aluminum oxide. In some embodiments, a material of the outer crucible 136 may include, but not be limited to, graphite, aluminum oxide, zirconium oxide, iridium, platinum, tungsten, tantalum, or molybdenum. In some embodiments, the material of the inner crucible 135 may be a relatively high-cost material, ensuring the purity of raw materials of a crystal growth and a stability of the crystal growth. The material of the outer crucible 136 may be a relatively low-cost material, reducing the cost as much as possible while requirements for the crystal growth are satisfied. As an example, the inner crucible 135 may be an iridium crucible and the outer crucible 136 may be a graphite crucible.

In some embodiments, a thickness of the inner crucible 135 may be smaller than a thickness of the outer crucible 136, thereby reducing the cost. In some embodiments, the thickness of the inner crucible 135 may be within a range from 0.1 millimeters to 5 millimeters. In some embodiments, the thickness of the inner crucible 135 may be within a range from 0.1 millimeters to 2 millimeters. In some embodiments, the thickness of the inner crucible 135 may be within a range from 0.2 millimeters to 1.8 millimeters. In some embodiments, the thickness of the inner crucible 135 may be within a range from 0.3 millimeters to 1.6 millimeters. In some embodiments, the thickness of the inner crucible 135 may be within a range from 0.4 millimeters to 1.4 millimeters. In some embodiments, the thickness of the inner crucible 135 may be within a range from 0.5 millimeters to 1.2 millimeters. In some embodiments, the thickness of the inner crucible 135 may be within a range from 0.6 millimeters to 1.1 millimeters. In some embodiments, the thickness of the inner crucible 135 may be within a range from 0.7 millimeters to 1 millimeter. In some embodiments, the thickness of the inner crucible 135 may be within a range from 0.8 millimeters to 0.9 millimeters.

In some embodiments, the thickness of the outer crucible 136 may be within a range from 1 millimeter to 50 millimeters. In some embodiments, the thickness of the outer crucible 136 may be within a range from 1 millimeter to 20 millimeters. In some embodiments, the thickness of the outer crucible 136 may be within a range from 1 millimeter to 10 millimeters. In some embodiments, the thickness of the outer crucible 136 may be within a range from 2 millimeters to 9 millimeters. In some embodiments, the thickness of the outer crucible 136 may be within a range from 3 millimeters to 8 millimeters. In some embodiments, the thickness of the outer crucible 136 may be within a range from 4 millimeters to 7 millimeters. In some embodiments, the thickness of the outer crucible 136 may be within a range from 5 millimeters to 6 millimeters.

In some embodiments, in order to ensure a temperature gradient suitable for a crystal growth, a ratio between a diameter of the crucible component 130 (e.g., an inner diameter of the inner crucible 135) and a height of the crucible component 130 (e.g., a height of the outer crucible 136) may be within a certain range. In some embodiments, the ratio between the diameter of the crucible component 130 and the height of the crucible component 130 may be within a range from 1:0.2 to 1:8. In some embodiments, the ratio between the diameter of the crucible component 130 and the height of the crucible component 130 may be within a range from 1:0.4 to 1:7. In some embodiments, the ratio between the diameter of the crucible component 130 and the height of the crucible component 130 may be within a range from 1:0.5 to 1:6. In some embodiments, the ratio between the diameter of the crucible component 130 and the height of the crucible component 130 may be within a range from 1:0.7 to 1:5. In some embodiments, the ratio between the diameter of the crucible component 130 and the height of the crucible component 130 may be within a range from 1:0.9 to 1:4. In some embodiments, the ratio between the diameter of the crucible component 130 and the height of the crucible component 130 may be within a range from 1:1.1 to 1:3. In some embodiments, the ratio between the diameter of the crucible component 130 and the height of the crucible component 130 may be within a range from 1:1.3 to 1:2.5. In some embodiments, the ratio between the diameter of the crucible component 130 and the height of the crucible component 130 may be within a range from 1:1.5 to 1:2. In some embodiments, the ratio between the diameter of the crucible component 130 and the height of the crucible component 130 may be within a range from 1:1.7 to 1:1.8.

In some embodiments, in order to maintain a stable temperature field environment, a ratio between the diameter of the crucible component 130 (e.g., the inner diameter of the inner crucible 135) and a height of the heat insulation drum 120 may be within a certain range. In some embodiments, the ratio between the diameter of the crucible component 130 and the height of the heat insulation drum 120 may be within a range from 1:1 to 1:12. In some embodiments, the ratio between the diameter of the crucible component 130 and the height of the heat insulation drum 120 may be within a range from 1:2 to 1:11. In some embodiments, the ratio between the diameter of the crucible component 130 and the height of the heat insulation drum 120 may be within a range from 1:3 to 1:10. In some embodiments, the ratio between the diameter of the crucible component 130 and the height of the heat insulation drum 120 may be within a range from 1:4 to 1:9. In some embodiments, the ratio between the diameter of the crucible component 130 and the height of the heat insulation drum 120 may be within a range from 1:4.5 to 1:8.5. In some embodiments, the ratio between the diameter of the crucible component 130 and the height of the heat insulation drum 120 may be within a range from 1:5 to 1:8. In some embodiments, the ratio between the diameter of the crucible component 130 and the height of the heat insulation drum 120 may be within a range from 1:5.5 to 1:7.5. In some embodiments, the ratio between the diameter of the crucible component 130 and the height of the heat insulation drum 120 may be within a range from 1:6 to 1:7.

In some embodiments, the inner crucible 135 may be formed by at least one inner sub-crucible. In some embodiments, material(s) and size(s) of the at least one inner sub-crucible may be the same or different. In some embodiments, the at least one inner sub-crucible may be tightly fitted. In some embodiments, there may be an inner sub-gap between at least two inner sub-crucibles. In some embodiments, the inner sub-gaps may be the same or different.

In some embodiments, the outer crucible 136 may be formed by at least one outer sub-crucible. In some embodiments, material(s) and size(s) of the outer sub-crucible may be the same or different. In some embodiments, the at least one outer sub-crucible may be tightly fitted. In some embodiments, there may be an outer sub-gap between at least two outer sub-crucibles. In some embodiments, the outer sub-gaps may be the same or different.

In some embodiments, as shown in FIG. 5, the crucible component 130 may also include a crucible cover 137. In some embodiments, the crucible cover 137 may be equipped with a through hole 1371 through which the pulling component may be movable above the crucible component 130. In some embodiments, the crucible cover 137 may also be equipped with an annular groove 1372. The annular groove 1372 may be configured to clamp with an upper end of the inner crucible 135. In some embodiments, an upper surface of the inner crucible 135 may be higher than an upper surface of the outer crucible 136. In some embodiments, at least a portion of the inner crucible 135 that is higher than the outer crucible 136 may be clamped with the annular groove 1372 to prevent a movement of the inner crucible 135 and further stabilize the temperature field required for the crystal growth.

Figure 6:
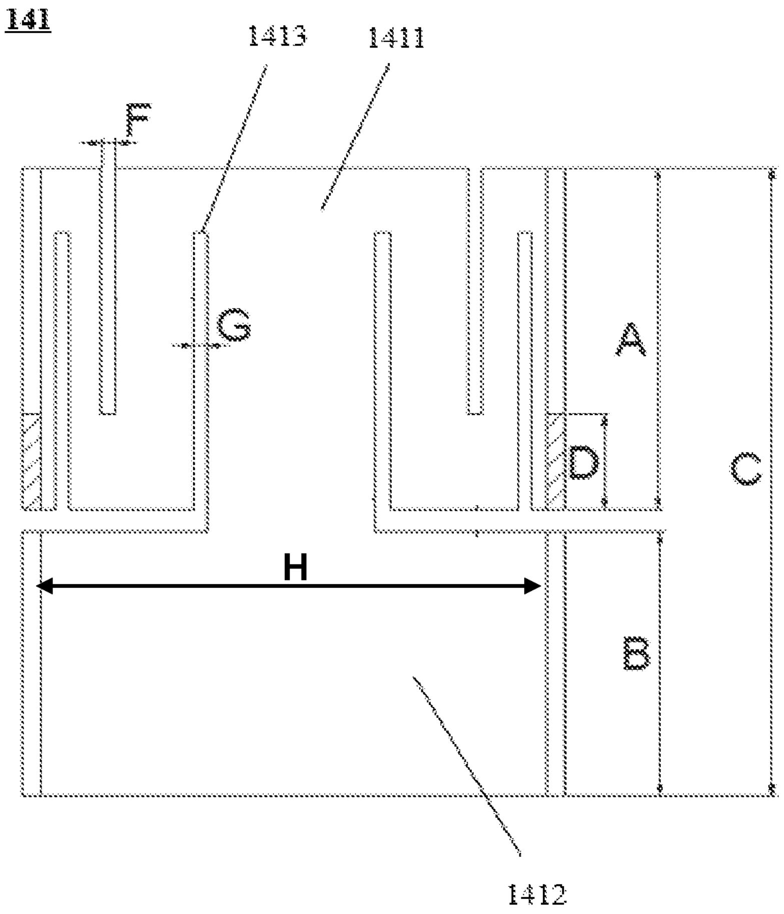
FIG. 6 is a schematic diagram illustrating an exemplary structure of a heating body according to some embodiments of the present disclosure.

FIG. 6 is a schematic diagram illustrating an exemplary structure of a heating body according to some embodiments of the present disclosure.

In some embodiments, the heating body 141 may be a hollow column. The heating body 141 may be located around an outer circumference of the crucible component 130. FIG. 6 can be understood as a section view of the hollow column.

In some embodiments, in order to ensure a heating effect of the heating body 141 and a heat conductive effect between the heating body 141 and the crucible component 130, a ratio between an inner diameter (e.g., "H" shown in FIG. 6) of the heating body 141 and a height (e.g., "C" shown in FIG. 6) of the heating body 141 may need to satisfy a certain requirement.

In some embodiments, the ratio between the inner diameter of the heating body 141 and the height of the heating body 141 may be within a range from 1:1 to 1:20. In some embodiments, the ratio between the inner diameter of the heating body 141 and the height of the heating body 141 may be within a range from 1:1 to 1:18. In some embodiments, the ratio between the inner diameter of the heating body 141 and the height of the heating body 141 may be within a range from 1:1 to 1:16. In some embodiments, the ratio between the inner diameter of the heating body 141 and the height of the heating body 141 may be within a range from 1:1 to 1:14. In some embodiments, the ratio between the inner diameter of the heating body 141 and the height of the heating body 141 may be within a range from 1:1 to 1:12. In some embodiments, the ratio between the inner diameter of the heating body 141 and the height of the heating body 141 may be within a range from 1:1 to 1:10. In some embodiments, the ratio between the inner diameter of the heating body 141 and the height of the heating body 141 may be within a range from 1:1 to 1:8. In some embodiments, the ratio between the inner diameter of the heating body 141 and the height of the heating body 141 may be within a range from 1:1 to 1:6. In some embodiments, the ratio between the inner diameter of the heating body 141 and the height of the heating body 141 may be within a range from 1:1 to 1:5. In some embodiments, the ratio between the inner diameter of the heating body 141 and the height of the heating body 141 may be within a range from 1:1 to 1:4. In some embodiments, the ratio between the inner diameter of the heating body 141 and the height of the heating body 141 may be within a range from 1:1 to 1:3. In some embodiments, the ratio between the inner diameter of the heating body 141 and the height of the heating body 141 may be within a range from 1:1 to 1:2. In some embodiments, the ratio between the inner diameter of the heating body 141 and the height of the heating body 141 may be within a range from 1:1 to 1:1.5.

In some embodiments, the heating body 141 may include a heat generation portion 1411 configured to provide heat. In some embodiments, in order to ensure that the heating body 141 and the heat insulation drum 120 can form a temperature field required for a crystal growth, a ratio between a height (e.g., "A" shown in FIG. 6) of the heat generation portion 1411 and a height (e.g., the height of the heat insulation drum 120) of the temperature field may need to meet a certain requirement. In some embodiments, the ratio between the height of the heat generation portion 1411 and the height of the heat insulation drum 120 may be within a range from 1:1 to 1:20. In some embodiments, the ratio between the height of the heat generation portion 1411 and the height of the heat insulation drum 120 may be within a range from 1:2 to 1:18. In some embodiments, the ratio between the height of the heat generation portion 1411 and the height of the heat insulation drum 120 may be within a range from 1:3 to 1:16. In some embodiments, the ratio between the height of the heat generation portion 1411 and the height of the heat insulation drum 120 may be within a range from 1:4 to 1:14. In some embodiments, the ratio between the height of the heat generation portion 1411 and the height of the heat insulation drum 120 may be within a range from 1:5 to 1:12. In some embodiments, the ratio between the height of the heat generation portion 1411 and the height of the heat insulation drum 120 may be within a range from 1:6 to 1:10. In some embodiments, the ratio between the height of the heat generation portion 1411 and the height of the heat insulation drum 120 may be within a range from 1:7 to 1:9.

In some embodiments, in order to ensure a temperature gradient suitable for the crystal growth, a ratio between the height of the crucible component 130 and the height of the heat generation portion 1411 may be within a certain range. In some embodiments, the ratio between the height of the crucible component 130 and the height of the heat generation portion 1411 may be within a range from 1:1 to 1:5. In some embodiments, the ratio between the height of the crucible component 130 and the height of the heat generation portion 1411 may be within a range from 1:1.5 to 1:4.5. In some embodiments, the ratio between the height of the crucible component 130 and the height of the heat generation portion 1411 may be within a range from 1:2 to 1:4. In some embodiments, the ratio between the height of the crucible component 130 and the height of the heat generation portion 1411 may be within a range from 1:2.5 to 1:3.5. In some embodiments, the ratio between the height of the crucible component 130 and the height of the heat generation portion 1411 may be within a range from 1:2.7 to 1:3.3. In some embodiments, the ratio between the height of the crucible component 130 and the height of the heat generation portion 1411 may be within a range from 1:2.9 to 1:3.1. In some embodiments, the ratio between the height of the crucible component 130 and the height of the heat generation portion 1411 may be 1:3.

In some embodiments, the heating body 141 may also include an electrode portion 1412. The electrode portion 1412 may be configured to connect the heat generation portion 1411 and a power source. In some embodiments, the heat generation portion 1411 and the electrode portion 1412 may be an integral structure. In some embodiments, the heat generation portion 1411 and the electrode portion 1412 may be connected via a conductor.

In some embodiments, in order to provide sufficient heat to ensure the temperature field required for the crystal growth, a ratio between the height (e.g., "A" shown in FIG. 6) of the heat generation portion 1411 and a height (e.g., "B" shown in FIG. 6) of the electrode portion 1412 may need to satisfy a certain requirement. In some embodiments, the ratio between the height of the heat generation portion 1411 and the height of the electrode portion 1412 may be within a range from 0.5:1 to 10:1. In some embodiments, the ratio between the height of the heat generation portion 1411 and the height of the electrode portion 1412 may be within a range from 0.8:1 to 9:1. In some embodiments, the ratio between the height of the heat generation portion 1411 and the height of the electrode portion 1412 may be within a range from 1:1 to 8:1. In some embodiments, the ratio between the height of the heat generation portion 1411 and the height of the electrode portion 1412 may be within a range from 2:1 to 7:1. In some embodiments, the ratio between the height of the heat generation portion 1411 and the height of the electrode portion 1412 may be within a range from 3:1 to 6:1. In some embodiments, the ratio between the height of the heat generation portion 1411 and the height of the electrode portion 1412 may be within a range from 4:1 to 5:1.

In some embodiments, a plurality of heating units may be obtained by grooving the heat generation portion 1411 of the heating body 141. In some embodiments, the grooving may include sequentially grooving an upper portion and grooving a lower portion on the heat generation portion 1411. As shown in FIG. 6, the plurality of heating units obtained after grooving may be connected to each other.

In some embodiments, sizes of the grooves 1413 may be the same. Accordingly, resistance values of the plurality of heating units may be the same and heats generated by the plurality of heating units may be the same, thereby achieving a uniform distribution of temperatures inside the temperature field device. In some embodiments, since the resistance values of the plurality of heating units are the same, the temperature field may be controlled and adjusted by adjusting a height and/or a thickness of the heat insulation layer 150 and/or heating powers (or currents) of the plurality of heating units. Accordingly, the temperature field can be simply and highly effectively adjusted.

In some embodiments, in order to match a resistance value of the heating body 141 with the power source, a count of the grooves of the heating body 141 may need to be controlled within a certain range. In some embodiments, the count of the grooves of the heating body 141 may be from 2 to 42. In some embodiments, the count of the grooves of the heating body 141 may be from 2 to 40. In some embodiments, the count of the grooves of the heating body 141 may be from 3 to 38. In some embodiments, the count of the grooves of the heating body 141 may be from 4 to 36. In some embodiments, the count of the grooves of the heating body 141 may be from 6 to 34. In some embodiments, the count of the grooves of the heating body 141 may be from 8 to 32. In some embodiments, the count of the grooves of the heating body 141 may be from 10 to 30. In some embodiments, the count of the grooves of the heating body 141 may be from 12 to 28. In some embodiments, the count of the grooves of the heating body 141 may be from 14 to 26. In some embodiments, the count of the grooves of the heating body 141 may be from 16 to 24. In some embodiments, the count of the grooves of the heating body 141 may be from 18 to 22. In some embodiments, the count of the grooves of the heating body 141 may be from 19 to 20.

In some embodiments, the count of the plurality of heating units obtained after grooving may be represented as (n+1), wherein n may represent the count of the grooves. In some embodiments, an arc length L of a single heating unit may be represented as $L=360°-n\alpha/n+1*r$, wherein $\alpha$ may represent a central angle of the groove 1413 and r may represent a radius of the heating body 141. In some embodiments, a depth (e.g., "D" shown in FIG. 6) of a portion of the heating body 141 without grooving may be equal to or different from the arc length L of the single heating unit.

In some embodiments, in order to ensure a temperature gradient suitable for a crystal growth, a ratio (i.e., (A-D):A) between a groove depth (e.g., "A-D" shown in FIG. 6) of the heating body 141 and the height of the heat generation portion 1411 may need to satisfy a certain requirement. In some embodiments, the ratio between the groove depth of the heating body 141 and the height of the heat generation portion 1411 may be within a range from 1:1.1 to 1:8. In some embodiments, the ratio between the groove depth of the heating body 141 and the height of the heat generation portion 1411 may be within a range from 1:1.2 to 1:7. In some embodiments, the ratio between the groove depth of the heating body 141 and the height of the heat generation portion 1411 may be within a range from 1:1.3 to 1:6. In some embodiments, the ratio between the groove depth of the heating body 141 and the height of the heat generation portion 1411 may be within a range from 1:1.4 to 1:5. In some embodiments, the ratio between the groove depth of the heating body 141 and the height of the heat generation portion 1411 may be within a range from 1:1.5 to 1:4. In some embodiments, the ratio between the groove depth of the heating body 141 and the height of the heat generation portion 1411 may be within a range from 1:1.6 to 1:3. In some embodiments, the ratio between the groove depth of the heating body 141 and the height of the heat generation portion 1411 may be within a range from 1:1.7 to 1:2. In some embodiments, the ratio between the groove depth of the heating body 141 and the height of the heat generation portion 1411 may be within a range from 1:1.8 to 1:1.9.

In some embodiments, a groove width (e.g., "F" or "G" shown in FIG. 6) may need to satisfy a predetermined condition to prevent a spark phenomenon at a high temperature, causing a mutation of the temperature field and further affecting the crystal quality. In some embodiments, the groove width may be within a range from 0.5 millimeters to 20 millimeters. In some embodiments, the groove width may be within a range from 1 millimeter to 18 millimeters. In some embodiments, the groove width may be within a range from 2 millimeters to 16 millimeters. In some embodiments, the groove width may be within a range from 3 millimeters to 14 millimeters. In some embodiments, the groove width may be within a range from 4 millimeters to 12 millimeters. In some embodiments, the groove width may be within a range from 5 millimeters to 10 millimeters. In some embodiments, the groove width may be within a range from 6 millimeters to 9 millimeters. In some embodiments, the groove width may be within a range from 7 millimeters to 8 millimeters.

In some embodiments, in order to ensure a temperature field suitable for a crystal growth, a ratio (i.e., [F:(A-D)] or [G:(A-D)]) between the groove width (e.g., "F" or "G" shown in FIG. 6) of the heating body 141 and the groove depth of the heating body 141 may need to satisfy a certain requirement. In some embodiments, the ratio between the groove width of the heating body 141 and the groove depth of the heating body 141 may be within a range from 1:5 to 1:350. In some embodiments, the ratio between the groove width of the heating body 141 and the groove depth of the heating body 141 may be within a range from 1:10 to 1:330. In some embodiments, the ratio between the groove width of the heating body 141 and the groove depth of the heating body 141 may be within a range from 1:20 to 1:310. In some embodiments, the ratio between the groove width of the heating body 141 and the groove depth of the heating body 141 may be within a range from 1:30 to 1:290. In some embodiments, the ratio between the groove width of the heating body 141 and the groove depth may be within the range from 1:40 to 1:270. In some embodiments, the ratio between the groove width of the heating body 141 and the groove depth of the heating body 141 may be within a range from 1:50 to 1:250. In some embodiments, the ratio between the groove width of the heating body 141 and the groove depth of the heating body 141 may be within a range from 1:60 to 1:230. In some embodiments, the ratio between the groove width of the heating body 141 and the groove depth of the heating body 141 may be within a range from 1:70 to 1:210. In some embodiments, the ratio between the groove width of the heating body 141 and the groove depth of the heating body 141 may be within a range from 1:80 to 1:190. In some embodiments, the ratio between the groove width of the heating body 141 and the groove depth of the heating body 141 may be within a range from 1:90 to 1:170. In some embodiments, the ratio between the groove width of the heating body 141 and the groove depth of the heating body 141 may be within a range from 1:100 to 1:150. In some embodiments, the ratio between the groove width of the heating body 141 and the groove depth of the heating body 141 may be within a range from 1:110 to 1:130.

Figure 7A:
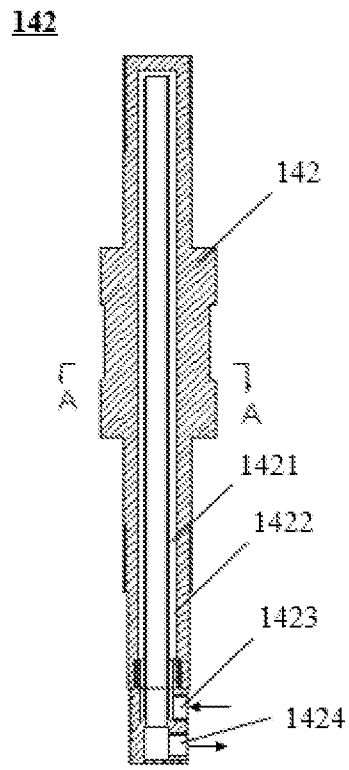
FIG. 7A is a schematic diagram illustrating an exemplary structure of an electrode rod according to some embodiments of the present disclosure.
Figure 7B:
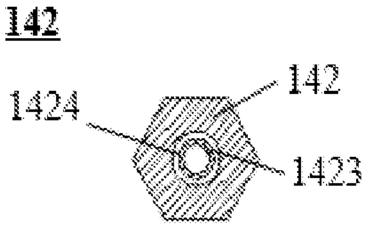
FIG. 7B is a section view illustrating the exemplary electrode rod in FIG. 7A along an A-A axis according to some embodiments of the present disclosure.

FIG. 7A is a schematic diagram illustrating an exemplary structure of an electrode rod according to some embodiments of the present disclosure. FIG. 7B is a section view illustrating the exemplary electrode rod in FIG. 7A along an A-A axis according to some embodiments of the present disclosure.

In some embodiments, in order to prevent a temperature of a connection component at a connection position of the lower sealing cover 122 or the bottom plate 112 and the heat insulation drum 120 from being too high to be damaged, resulting in affecting the sealing of the heat insulation drum 120, a cooling channel may be located inside the electrode rod 142. A cooling medium (e.g., cooling gas, cooling water, cooling oil) may be inlet in the cooling channel to cool the electrode rod 142, and further reduce a temperature of the lower sealing cover 122 or the bottom plate 112. In some embodiments, a material of the electrode rod 142 may include a conductive material, for example, copper (e.g., red copper, brass), aluminum, graphene, silver, etc.

As shown in FIG. 7A and FIG. 7B, an interior of the electrode rod 142 may be hollow. In some embodiments, the interior of the electrode rod 142 may be equipped with a hollow pipe 1421. In some embodiments, the hollow pipe 1421 may be connected (e.g., connected via a threading connection) to the electrode rod 142. In some embodiments, an outer wall of the hollow pipe 1421 and an inner wall of the electrode rod 142 may form a cooling annular gap 1422. In some embodiments, a side wall of the electrode rod 142 may be equipped with a water inlet 1423 and a water outlet 1424 configured to connect to the hollow pipe 1421 and the cooling annular gap 1422. Since the cooling annular gap 1422 and the inner wall of the electrode rod 142 can directly exchange thermal heat, the cooling medium may first enter the cooling annular gap 1422 via the water inlet 1423, enter the hollow pipe 1421 via the cooling annular gap 1422, and then flow out of the water outlet 1424. Accordingly, more thermal heat can be taken out and cooling efficiency can be improved.

Figure 8A:
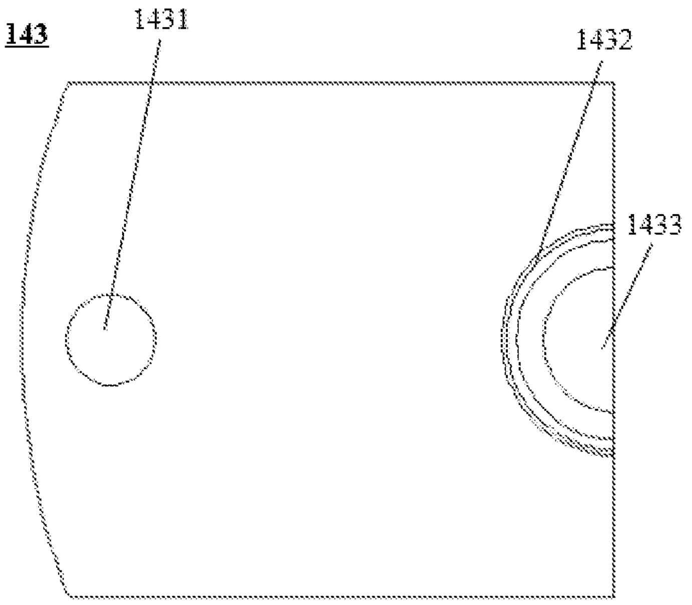
FIG. 8A is a schematic diagram illustrating an exemplary partial structure of an electrode plate according to some embodiments of the present disclosure.
Figure 8B:
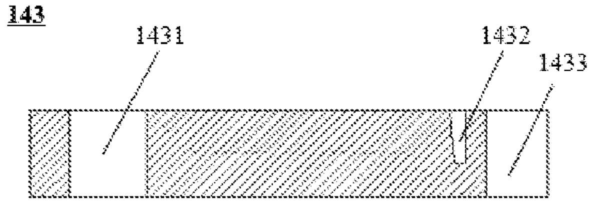
FIG. 8B is a section view illustrating the exemplary electrode plate in FIG. 8A according to some embodiments of the present disclosure.

FIG. 8A is a schematic diagram illustrating an exemplary partial structure of an electrode plate according to some embodiments of the present disclosure. FIG. 8B is a section view illustrating the exemplary electrode plate in FIG. 8A according to some embodiments of the present disclosure.

In some embodiments, the electrode plate 143 may be equipped with an electrode rod mounting hole 1431. A size of the electrode rod mounting hole 1431 may match a size of the electrode rod 142. The electrode rod 142 may be connected (e.g., connected via a threading connection) to the electrode plate 143 via the electrode rod mounting hole 1431. In some embodiments, the electrode rod 142 and the electrode plate 143 may be connected by pressing the electrode plate 143 via a screw. In some embodiments, a material of the electrode plate 143 may include a conductive material, for example, copper (e.g., red copper, brass), aluminum, graphene, silver, etc.

In some embodiments, the electrode plate 143 may be equipped with a heating body mounting hole 1432. A size of the heating body mounting hole 1432 may match a size of the heating body 141. The heating body 141 may be connected (e.g., connected via a clamping connection, a threading connection) to the electrode plate 143 via the heating body mounting hole 1432.

In some embodiments, the electrode plate 143 may be equipped with a cushion block through hole 1433. The cushion block through hole 1433 may be configured to allow the cushion block 133 to be placed.

In some embodiments, at least a portion of at least one fastening ring 144 may be located inside the heating body mounting hole 1432 and at least a portion of the at least one fastening ring 144 may be located around an outer circumference of the heating body 141. Accordingly, a connection between the heating body 141 and the electrode plate 143 can be more stable, and a concentricity of the heating body 141 can be further ensured, making a temperature field required for a crystal growth more uniform and stable.

Figure 9:
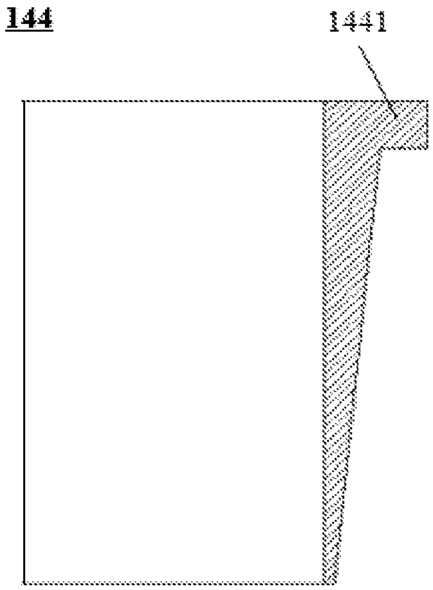
FIG. 9 is a schematic diagram illustrating an exemplary structure of a fastening ring according to some embodiments of the present disclosure.

FIG. 9 is a schematic diagram illustrating an exemplary structure of a fastening ring according to some embodiments of the present disclosure. As shown in FIGS. 8A, 8B, and 9, external diameter(s) of the at least one fastening ring 144 may gradually increase along a direction from a bottom portion of the heating body mounting hole 1432 to an upper end surface of the electrode plate 143, thereby stabilizing and fixing the heating body 141.

In some embodiments, an upper side of the at least one fastening ring 144 may be equipped with a clamping plate 1441. In some embodiments, after the at least one fastening ring 144 is clamped with the heating body mounting hole 1432, the clamping plate 1441 may be located at an upper portion of the electrode plate 143, thereby stabilizing and fixing the clamping plate 1441. In some embodiments, an arc length of the clamping plate 1441 of the at least one fastening ring 144 may be equal to or different from a half of an arc length of the heating body 141.

Figure 10A:
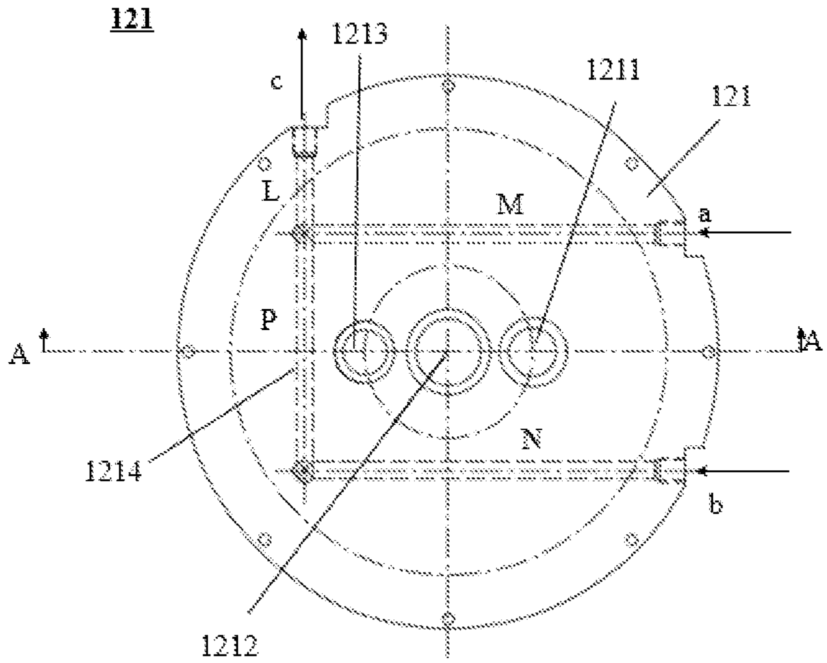
FIG. 10A is a top view illustrating an exemplary upper sealing cover according to some embodiments of the present disclosure.
Figure 10B:
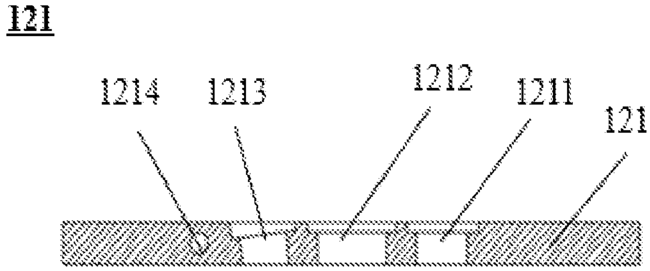
FIG. 10B is a section view illustrating the exemplary upper sealing cover in FIG. 10A along an A-A axis according to some embodiments of the present disclosure.

FIG. 10A is a top view illustrating an exemplary upper sealing cover according to some embodiments of the present disclosure. FIG. 10B is a section view illustrating the exemplary upper sealing cover in FIG. 10A along an A-A axis according to some embodiments of the present disclosure.

As shown in FIGS. 10A and 10B, the upper sealing cover 121 may be equipped with a first through hole 1211, a second through hole 1212, a third through hole 1213, and an upper cooling channel 1214.

In some embodiments, the heat insulation drum 120 may be fixedly connected (e.g., connected via a threading connection, a welding connection) to and communicated to a vacuum device via the first through hole 1211 and a pipe.

In some embodiments, the heat insulation drum 120 may be fixedly connected (e.g., connected via a threading connection, a welding connection) to and communicated to a sealing sleeve 180 via the second through hole 1212. The pulling device 160 may pass through the second through hole 1212 and reach inside the heat insulation drum 120 to execute Czochralski crystal growth.

In some embodiments, an end (e.g., a lower end) of the observation piece 123 may be communicated to the heat insulation drum 120 via the third through hole 1213. In some embodiments, another end (e.g., an upper end) of the observation piece 123 may be sealed to maintain a pressure environment inside the heat insulation drum 120.

In some embodiments, a cooling medium (e.g., cooling gas, cooling water, cooling oil) may be inlet to the upper cooling channel 1214 to cool the upper sealing cover 121 to prevent a temperature of a connection component (e.g., a sealing ring of silica gel) at a connection position of the upper sealing cover 121 and the heat insulation drum 120 from being too high to be damaged, resulting in affecting the sealing of heat insulation drum 120.

In some embodiments, in order to sufficiently cool the upper sealing cover 121, or in order to increase a cooling efficiency of the upper sealing cover 121, the upper sealing cover 121 may include at least two upper cooling channels 1214. In some embodiments, the at least two upper cooling channels 1214 may be uniformly or non-uniformly distributed inside the upper sealing cover 121. As shown in FIG. 10A, the upper sealing cover 121 may include two upper cooling channels, referred to as a first cooling channel and a second cooling channel, respectively. In some embodiments, the first cooling channel may include a cooling branch M and a cooling branch L connected to each other. The second cooling channel may include a cooling branch N and a cooling branch P connected to each other. In some embodiments, the cooling branch M and the cooling branch N may be intersected or parallel. In some embodiments, the cooling branch L and the cooling branch P may be intersected or parallel. As shown in FIG. 10A, the cooling branch L and the cooling branch P may partially intersect. The cooling medium may enter the cooling branch M via a port a, enter the cooling branch L, and then flow out from a port c. The cooling medium may also enter the cooling branch N from a port b, enter the cooling branch P, and then flow out from the port c.

Figure 11A:
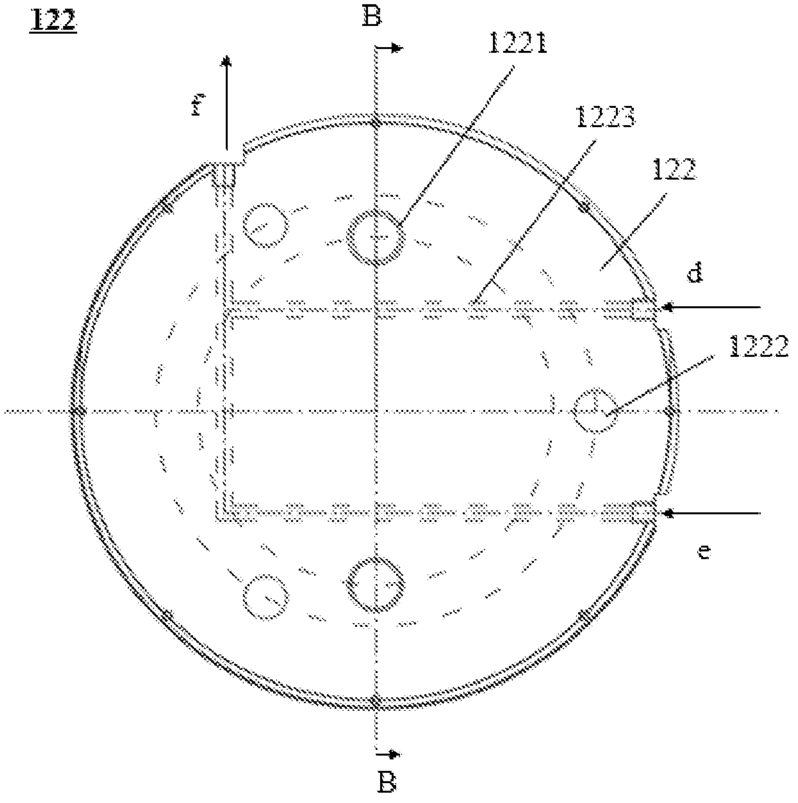
FIG. 11A is a bottom view illustrating an exemplary lower sealing cover according to some embodiments of the present disclosure.
Figure 11B:
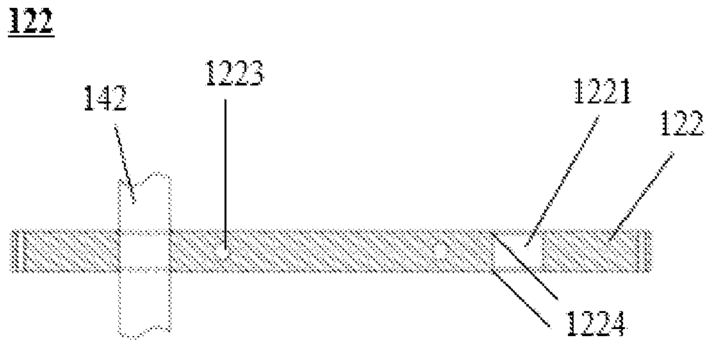
FIG. 11B is a section view illustrating the exemplary lower sealing cover in FIG. 11A along a B-B axis according to some embodiments of the present disclosure.

FIG. 11A is a bottom view illustrating an exemplary lower sealing cover according to some embodiments of the present disclosure. FIG. 11B is a section view illustrating the exemplary lower sealing cover in FIG. 11A along a B-B axis according to some embodiments of the present disclosure.

In some embodiments, the lower sealing cover 122 may include a flange. As shown in FIG. 11A and FIG. 11B, the lower sealing cover 122 may be equipped with a fourth through hole 1221, a supporting hole 1222, and a lower cooling channel 1223.

In some embodiments, at least a portion of the electrode rod 142 may pass through the fourth through hole 1221 and be communicated with a power source to form a current circuit. In some embodiments, a count of the fourth through holes 1221 may be equal to a count of electrode rods 142. In some embodiments, a size of the fourth through hole 1221 may match a size of the electrode rod 142. In some embodiments, the electrode rod 142 may be connected (e.g., connected via a threading connection) to the lower sealing cover 122 via the fourth through hole 1221. In some embodiments, at least one end surface of the fourth through hole 1221 may be equipped with a chamfer 1224. In some embodiments, the electrode rod 142 and the lower sealing cover 122 may be sealed via the chamfer 1224, a sealing ring, and a sealing cushion. In some embodiments, the electrode rod 142 and the bottom plate 112 may be sealed with the chamfer 1224, a sealing ring, and a sealing cushion. In some embodiments, the electrode rod 142 and the furnace 110 (or the bottom plate 112) or other components (e.g., the heat insulation drum 120, the heat insulation drum 190, the heat insulation layer 150) may be insulated via a sealing ring and/or a sealing sleeve, thereby preventing the electrode rod 142 from communicating with the furnace 110 or other components, resulting in an electric leakage and further failing to heat the heating body 141. In some embodiments, the sealing ring and the sealing cushion may be sleeved on the electrode rod 142 to make that the sealing ring is fitted with an inclined surface of the chamfer 1224. Then the sealing ring may be tightly pressed using the sealing cushion. Accordingly, the electrode rod 142 may be sealedly connected to the lower sealing cover 122. In some embodiments, a material of the sealing ring, the sealing sleeve, and the sealing cushion may be an insulating material (e.g., rubber, plastic), thereby preventing the electric leakage and ensuring safety.

An angle of the chamfer may affect a sealing effect. For example, if the angle of the chamfer is relatively large, the sealing ring may fail to be pressed tightly via the sealing cushion. If the angle of the chamfer is relatively small, a fitting area between the sealing ring and the inclined surface of the chamfer 1224 may be relatively small, causing a bad sealing effect. Therefore, in some embodiments, the angle of the chamfer 1224 may be controlled to be within a certain range. In the present disclosure, the angle of the chamfer 1224 may refer to an angle between the inclined surface of the chamfer 1224 and the upper side surface or the lower side surface of the lower sealing cover 122.

In some embodiments, the angle of the chamfer 1224 may be within a range from 30 degrees to 60 degrees. In some embodiments, the angle of the chamfer 1224 may be within a range from 35 degrees to 55 degrees. In some embodiments, the angle of the chamfer 1224 may be within a range from 40 degrees to 50 degrees. In some embodiments, the angle of the chamfer 1224 may be within a range from 42 degrees to 48 degrees. In some embodiments, the angle of the chamfer 1224 may be 45 degrees.

In some embodiments, the lower sealing cover 122 may also include a supporting rod. In some embodiments, a portion of the supporting rod may extend into a supporting hole 1222. In some embodiments, a top end of the supporting rod may be in contact with the supporting hole 1222 to adjust a horizontal levelness of the lower sealing cover 122 and further adjust a horizontal levelness of the temperature field device. Accordingly, a temperature field required for a crystal growth may be more uniform and stable.

In some embodiments, the supporting holes 1222 may be uniformly or non-uniformly distributed on a lower bottom surface of the lower sealing cover 122. In some embodiments, the supporting hole 1222 may be a blind hole. In some embodiments, a size of the supporting hole 1222 may match the supporting rod.

In some embodiments, a cooling medium (e.g., cooling gas, cooling water, cooling oil) may be inlet into the lower cooling channel 1223 to cool the lower cooling channel 1223, thereby preventing a temperature of a connection component (e.g., a sealing ring of silica gel) at a connection position of the lower cooling channel 1223 and the heat insulation drum 120 from being too high to be damaged, resulting in affecting the sealing of the heat insulation drum 120. In some embodiments, an arrangement of the lower cooling channel 1223 may be the same as or different from the upper cooling channel 1214. More descriptions regarding the lower cooling channel 1223 may be found elsewhere in the present disclosure (e.g., FIG. 10A, FIG. 10B, and the descriptions thereof), which are not repeated. In FIG. 11A, d and e may represent inlets of the cooling medium, and f may represent an outlet of the cooling medium.

A mounting process of a crystal preparation system (e.g., the crystal preparation system 100) may further be illustrated referring to the temperature field device shown in FIG. 2.

S1, the lower sealing cover 122 may be fixed and a horizontal levelness of the lower sealing cover 122 may be adjusted. The horizontal levelness may refer to a difference between heights of two ends of a component per unit length after the component is placed stably. The horizontal levelness may be required to be no larger than 10 millimeters per meter.

S2, the electrode rod 142 may be mounted. An insulation cushion, a sealing ring, and an insulation ring may be sequentially sleeved on the electrode rod 142. The electrode rod 142 may be passed through the fourth through hole 1221 of the lower sealing cover 122. A sealing ring and an insulation cushion may be sequentially sleeved on another end of the electrode rod 142 passing through the lower sealing cover 122. A nut may then be threaded and pressed.

S3, two electrode plates 143 may be mounted on the electrode rod 142 via the electrode rod mounting holes 1431 of the electrode plates 143. A horizontal levelness of the two electrode plates 143 may be required to be no larger than 10 millimeters per meter. A concentricity of circular holes used to place the heating body 141 or the through holes 1433 of the cushion block between the two electrode plates 143 may be adjusted. The two electrode plates 143 may then be fixed.

S4, the bottom tray 134 and the cushion block 133 may be mounted. The bottom heat insulation layer 153 and the crucible tray 132 may be mounted. A concentricity of the bottom tray 134, the cushion block 133, the bottom heat insulation layer 153, and the crucible tray 132 may be adjusted to be no more than 10 millimeters.

S5, the heating body 141 may be mounted through the heating body mounting hole 1432 of the electrode plate 143. A concentricity of the heating body 141 may be adjusted. The fastening ring 144 may be mounted inside the heating body mounting hole 1432 and mounted on an outer side of the heating body 141 to press the heating body 141.

S6, the side heat insulation layer 152 may be mounted. A concentricity of the side heat insulation layer 152 may be adjusted.

S7, the crucible component 130 may be mounted. The crucible component 130 may be placed on the crucible tray 132. A concentricity of the crucible component 130 and the heating body 141 may be adjusted.

S8, the top heat insulation layer 151 may be mounted.

S10, the heat insulation drum 120 may be mounted.

S11, materials may be filled according to a preparation requirement. The upper sealing cover 121, the observation piece 123, the vacuum device, the pulling device 160, and the sealing sleeve 180 may be mounted. The furnace 110 may be mounted. The concentricity of the upper sealing cover 121, the observation piece 123, the vacuum device, the pulling device 160, the sealing sleeve 180, or the furnace 110 may be adjusted and fixed.

S12, the vacuum device may be started to vacuum. The crystal preparation system may be prepared to grow a crystal.

In the above embodiments, a concentricity of all components (e.g., the heating body 141, the crucible component 130, the crucible tray 132, the heat insulation drum 120, the heat insulation layer 150) may be no larger than 20 millimeters and a perpendicularity thereof may be no larger than 10 degrees.

It should be noted that the above embodiments may be used as examples. Parameters involved in the preparation process may be different in different embodiments. The above operations may not be unique. In different embodiments, an order of the operations may be adjusted, and one or more operations may even be omitted. The above examples may not be understood as limiting the scope of the present disclosure.

The possible beneficial effects of the embodiments of the present disclosure may include, but not be limited to the following. (1) The crucible component may at least include an inner crucible and an outer crucible. A material of the inner crucible may include at least one of iridium, platinum, tungsten, tantalum, molybdenum, or quartz. A material of the outer crucible may include at least one of graphite, aluminum oxide, or zirconium oxide. A thickness of the inner crucible may be smaller than a thickness of the outer crucible. Further, a volume of a gap between the inner crucible and the outer crucible may be controlled, and the gap between the inner crucible and the outer crucible may be filled with a filler. Accordingly, a cost of a crystal growth can be reduced while the crystal quality can be ensured. (2) A temperature field required for a crystal growth may be provided using a resistance heating component, which can not only prevent the crucible component from being broken by fire and protect the crucible component, but also improve an energy conversion efficiency and form a uniform and stable temperature field. (3) A plurality of heating units with a same resistance value may be obtained by grooving a heating body. The plurality of heating units may not only form a uniform and stable temperature field required for a crystal growth, but also make an adjustment and a control of the temperature field easier, which may be more conducive to maintaining a temperature of the temperature field. (4) By adjusting a height and/or a thickness of a heat insulation layer using a temperature control device, a temperature field required for a crystal growth can be accurately and dynamically adjusted, thereby improving the crystal quality. It should be noted that different embodiments may have different beneficial effects. In different embodiments, possible beneficial effects may be any of the above effects, or any combination thereof, or any other beneficial effects that may be obtained.

The basic concepts have been described above. Obviously, for those skilled in the art, the detailed disclosure is merely by way of example, and does not constitute a limitation on the present disclosure. Although not explicitly stated here, those skilled in the art may make various modifications, improvements, and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. In addition, certain features, structures, or characteristics in one or more embodiments of the present disclosure may be appropriately combined.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installing on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of a count of reported significant digits and by applying ordinary rounding techniques. Notwithstanding that the numerical ranges and parameters configured to illustrate the broad scope of some embodiments of the present disclosure are approximations, the numerical values in specific examples may be as accurate as possible within a practical scope.

Each patent, patent application, patent application publication and other materials cited herein, such as articles, books, instructions, publications, documents, etc., are hereby incorporated by reference in their entirety. In addition to the application history documents that are inconsistent or conflicting with the contents of the present disclosure, the documents that may limit the widest range of the claim of the present disclosure (currently or later attached to this application) are excluded from the present disclosure. It should be noted that if the description, definition, and/or terms used in the appended application of the present disclosure is inconsistent or conflicting with the content described in the present disclosure, the use of the description, definition and/or terms of the present disclosure shall prevail.

At last, it should be understood that the embodiments described in the present disclosure are merely illustrative of the principles of the embodiments of the present disclosure. Other modifications may be within the scope of the present disclosure. Accordingly, by way of example, and not limitation, alternative configurations of embodiments of the present disclosure may be considered to be consistent with the teachings of the present disclosure. Accordingly, embodiments of the present disclosure are not limited to the embodiments that are expressly introduced and described herein.

What is claimed is:

1. A crystal preparation system, comprising:

a furnace;

a heat insulation drum, the heat insulation drum being located inside the furnace;

a crucible component, the crucible component being located inside the heat insulation drum;

a resistance heating component, the resistance heating component including a heating body, the heating body including a plurality of heating units, the plurality of heating units forming a uniform temperature field;

a heat insulation layer, the heat insulation layer including a top heat insulation layer and a side heat insulation layer, the side heat insulation layer being located around an outside of the plurality of heating units, the top heat insulation layer covering a top of the plurality of heating units and a top of the crucible component, wherein the heat insulation drum is configured to accommodate the heat insulation layer;

a temperature control device, wherein the temperature control device is configured to monitor crystal related parameters of crystal growth in the crucible component in real time;

determine temperature field information required for the crystal growth by inputting the crystal related parameters into a trained machine learning model;

automatically adjust the height and the thickness of the heat insulation layer in real time based on the temperature field information.

2. The crystal preparation system of claim 1, wherein the crucible component at least includes an inner crucible and an outer crucible.

3. The crystal preparation system of claim 2, wherein a material of the inner crucible includes at least one of iridium, platinum, tungsten, tantalum, molybdenum, or quartz, or a material of the outer crucible includes at least one of graphite, aluminum oxide, zirconium oxide, tungsten, molybdenum, or tantalum.

4. The crystal preparation system of claim 2, wherein a thickness of the inner crucible is smaller than a thickness of the outer crucible.

5. The crystal preparation system of claim 2, wherein the gap between the inner crucible and the outer crucible is filled with a filler.

6. The crystal preparation system of claim 5, wherein a ratio between a volume of the filler and a volume of the gap is within a range from 0.1:1 to 1:1.

7. The crystal preparation system of claim 2, wherein the outer crucible is formed by at least two outer sub-crucibles, and there is an outer sub-gap between the at least two outer sub-crucibles.

8. The crystal preparation system of claim 2, wherein the inner crucible is formed by at least two inner sub-crucibles, and there is an inner sub-gap between the at least two inner sub-crucibles.

9. The crystal preparation system of claim 1, wherein a distance between the plurality of heating units and the crucible component satisfies a predetermined condition.

10. The crystal preparation system of claim 1, wherein the plurality of heating units are obtained by grooving the heating body, and sizes of a plurality of grooves obtained by grooving the heating body are equal.

11. The crystal preparation system of claim 1, wherein a ratio between an inner diameter of the heating body and a height of the heating body is within a range from 1:1 to 1:20.

12. The crystal preparation system of claim 1, wherein a ratio between a height of the heating body and a height of the heat insulation drum is within a range from 1:1 to 1:5.

13. The crystal preparation system of claim 1, wherein the resistance heating component also includes a connection component, the connection component being configured to connect the heating body and a power source, wherein the connection component includes an electrode rod, at least a portion of the electrode rod passing through a through hole of a bottom plate of the furnace and connecting to the power source; and an end surface of the through hole is equipped with a chamfer, the electrode rod and the bottom plate being sealed via the chamfer, a sealing ring, and a sealing cushion.

14. The crystal preparation system of claim 13, wherein the connection component also includes an electrode plate, the electrode plate being equipped with an electrode rod mounting hole and a heating body mounting hole, wherein the electrode rod is connected to the electrode plate via the electrode rod mounting hole; and the heating body is connected to the electrode plate via the heating body mounting hole.

15. The crystal preparation system of claim 14, wherein the heating body is connected to the electrode plate via at least one fastening ring, at least a portion of the at least one fastening ring is located inside the heating body mounting hole, and at least a portion of the at least one fastening ring is located around an outer circumference of the heating body.

16. The crystal preparation system of claim 15, wherein at least one external diameter of the at least one fastening ring gradually increases along a direction from a bottom portion of the heating body mounting hole of the to an upper end surface of the electrode plate.

17. The crystal preparation system of claim 1, wherein the temperature control device is further configured to adjust a height and/or a thickness of the heat insulation layer based on a temperature distribution inside the heat insulation drum.

18. The crystal preparation system of claim 1, wherein the heat insulation drum includes an upper heat insulation drum, a middle heat insulation drum, and a lower heat insulation drum;

at least two of diameters of the upper insulation drum, the middle insulation drum, and the lower insulation drum are different;

the upper heat insulation drum is located above the middle heat insulation drum, and the lower heat insulation drum is located below the middle heat insulation drum; and the crucible component, the resistance heating component, and the heat insulation layer are accommodated in the middle heat insulation drum.

19. The crystal preparation system of claim 18, wherein the upper heat insulation drum includes an upper and inner heat insulation drum and an upper and outer heat insulation drum, and the upper and inner heat insulation drum is located inside the upper and outer heat insulation drum.

* * * * *